United States Patent
Rabet et al.

(10) Patent No.: US 12,249,963 B2
(45) Date of Patent: Mar. 11, 2025

(54) METHOD FOR ENHANCING POWER AMPLIFIER EFFICIENCY AND LINEARITY AND POWER AMPLIFIER

(71) Applicant: The Regents of the University of California, Oakland, CA (US)

(72) Inventors: Seyed Bagher Rabet, La Jolla, CA (US); Peter M. Asbeck, Del Mar, CA (US)

(73) Assignee: The Regents of the University of California, Oakland, CA (US)

( * ) Notice: Subject to any disclaimer, the term of this patent is extended or adjusted under 35 U.S.C. 154(b) by 467 days.

(21) Appl. No.: 17/628,083

(22) PCT Filed: Jul. 29, 2020

(86) PCT No.: PCT/US2020/044073
§ 371 (c)(1),
(2) Date: Jan. 18, 2022

(87) PCT Pub. No.: WO2021/021934
PCT Pub. Date: Feb. 4, 2021

(65) Prior Publication Data
US 2022/0263475 A1 Aug. 18, 2022

Related U.S. Application Data

(60) Provisional application No. 62/880,320, filed on Jul. 30, 2019.

(51) Int. Cl.
*H03F 1/07* (2006.01)
*H03F 1/02* (2006.01)
(Continued)

(52) U.S. Cl.
CPC ............. *H03F 1/0288* (2013.01); *H03F 1/32* (2013.01); *H03F 1/56* (2013.01); *H03F 3/245* (2013.01); *H03F 2200/451* (2013.01)

(58) Field of Classification Search
CPC ..................................... H03F 1/07; H03F 1/02
(Continued)

(56) References Cited

U.S. PATENT DOCUMENTS 6,639,464 B2   10/2003   Hellberg
7,215,716 B1    5/2007   Smith
(Continued)

OTHER PUBLICATIONS

International Search Report and Written Opinion from the corresponding International Patent Application No. PCT/US2020/044073, dated Oct. 5, 2020.
(Continued)

*Primary Examiner* — Henry Choe
(74) *Attorney, Agent, or Firm* — Greer, Burns & Crain, Ltd.; Steven P. Fallon

(57) ABSTRACT

A method for power amplification uses circuitry including a main amplifier and an auxiliary amplifier that are constructed and operate such that an input is applied to the main and auxiliary amplifiers via an input network. At low power levels, the auxiliary amplifier is off and the main amplifier sees a large impedance. At maximum power level, both the auxiliary and main amplifiers operate at full power and there is a constant phase shift between them. While transitioning from low to maximum power, systematic AM-AM and AM-PM variations generated due to the phase shift provided by the input network, bias differences between the main and auxiliary amplifiers, and nature of the output combiner to compensate device related distortions.

15 Claims, 18 Drawing Sheets

(51) Int. Cl.
  *H03F 1/32* (2006.01)
  *H03F 1/56* (2006.01)
  *H03F 3/24* (2006.01)

(58) Field of Classification Search
  USPC .............................................. 330/124 R, 295
  See application file for complete search history.

(56) References Cited

U.S. PATENT DOCUMENTS

| | | | | |
|---|---|---|---|---|
| 8,344,799 | B2* | 1/2013 | Hayakawa | H03F 1/0288 330/136 |
| 9,912,298 | B2* | 3/2018 | Lyalin | H03F 3/19 |
| 9,948,243 | B2* | 4/2018 | Kobayashi | H03F 3/193 |
| 10,432,148 | B2* | 10/2019 | Ahmed | H04L 7/0079 |
| 10,972,055 | B2* | 4/2021 | Naraine | H01P 5/16 |
| 2006/0103466 | A1 | 5/2006 | Shah et al. | |
| 2006/0114064 | A1 | 6/2006 | Shiikuma | |
| 2007/0298736 | A1* | 12/2007 | Fujioka | H03F 1/0266 455/127.3 |
| 2008/0231374 | A1 | 9/2008 | Buer et al. | |
| 2011/0199156 | A1* | 8/2011 | Hayakawa | H03F 1/0288 330/124 R |

OTHER PUBLICATIONS

Asbeck et al., "Power Amplifiers for mm-Wave 5G Applications: Technology Comparisons and CMOS-SOI Demonstration Circuits", IEEE Transactions on Microwave Theory and Techniques, 2019, pp. 3099-3109, vol. 67, No. 7, IEEE.

Doherty, "A New High Efficiency Power Amplifier for Modulated Waves", Proceedings of the Institute of Radio Engineers, 1936, pp. 1163-1182, vol. 24, No. 9, IEEE.

Chireix, "High Power Outphasing Modulation", Proceedings of the Institute of Radio Engineers, 1935, pp. 1370-1392, vol. 23, No. 11, IEEE.

Calvillo-Cortes et al., "Analysis of Pure- and Mixed-Mode Class-B Outphasing Amplifiers", 2014 IEEE 5th Latin American Symposium on Circuits and Systems, 2014, pp. 1-4, IEEE.

Jayamon et al., "Multigate-Cell Stacked FET Design for Millimeter-Wave CMOS Power Amplifiers", IEEE Journal of Solid-State Circuits, 2016, pp. 2027-2039, vol. 51, No. 9, IEEE.

Gerhard et al., "Improved Design of Outphasing Power Amplifier Combiners", 2009 German Microwave Conference, 2009, pp. 1-4, IEEE.

Jang et al., "RF-Input Self-Outphasing Doherty-Chireix Combined Amplifier", IEEE Transactions on Microwave Theory and Techniques, 2016, pp. 4518-4534, vol. 64, No. 12, IEEE.

Li et al., "A 28-GHz Flip-Chip Packaged Chireix Transmitter With On-Antenna Outphasing Active Load Modulation", IEEE Journal of Solid-State Circuits, 2019, pp. 1243-1253, vol. 54, No. 5, IEEE.

Levy et al., "A 14-GHz, 22-dBm Series Doherty Power Amplifier in 45-nm CMOS SOI, 2016 IEEE Compound Semiconductor Integrated Circuit Symposium (CSICS)", 2016, pp. 1-4, IEEE.

Lee et al., "A CMOS Outphasing Power Amplifier With Integrated Single-Ended Chireix Combiner", IEEE Transactions on Circuits and Systems—II: Express Briefs, 2010, pp. 411-415, vol. 57, No. 6, IEEE.

Martin et al., "An X-band RF-input Outphasing Power Amplifier", 2018 IEEE/MTT-S International Microwave Symposium—IMS, 2018, pp. 308-311, IEEE.

Rabet et al., "A High-Efficiency 28GHz Outphasing PA with 23dBm Output Power Using a Triaxial Balun Combiner", 2018 IEEE International Solid-State Circuits Conference, 2018, pp. 174-176, IEEE.

Raab, "Efficiency of Outphasing RF Power-Amplifier Systems", IEEE Transactions on Communications, 1985, pp. 1094-1099, vol. COM-33, No. 10, IEEE.

Rostomyan et al., "Comparison of pMOS and nMOS 28 GHz High Efficiency Linear Power Amplifiers in 45 nm CMOS SOI", 2018 IEEE Topical Conference on RF/Microwave Power Amplifiers for Radio and Wireless Applications (PAWR), 2018, pp. 26-28, IEEE.

Rostomyan et al., "28 GHZ Doherty Power Amplifier in CMOS SOI With 28% Back-Off PAE", IEEE Microwave and Wireless Components Letters, 2018, pp. 446-448, vol. 28, No. 5, IEEE.

Shakib et al., "A 28GHz Efficient Linear Power Amplifier for 5G Phased Arrays in 28nm Bulk CMOS", 2016 IEEE International Solid-State Circuits Conference, 2016, pp. 352-354, IEEE.

Shakib et al., "A Wideband 28GHz Power Amplifier Supporting 8×100MHz Carrier Aggregation for 5G in 40nm CMOS", 2017 IEEE International Solid-State Circuits Conference, 2017, pp. 44-46, IEEE.

Rostomyan et al., "A Ka-Band Asymmetric Dual Input CMOS SOI Doherty Power Amplifier with 25 dBm Output Power and High Back-Off Efficiency", 2019 IEEE Topical Conference on RF/Microwave Power Amplifiers for Radio and Wireless Applications (PAWR), 2019, pp. 1-4, IEEE.

Wang et al., "A Highly Linear Super-Resolution Mixed-Signal Doherty Power Amplifier for High-Efficiency mm-Wave 5G Multi-GB/s Communications", 2019 IEEE International Solid-State Circuits Conference, 2019, pp. 88-90, IEEE.

Van Der Wilt et al., "A Non-Isolated Power-Combining Antenna for Outphasing Radio Transmitters", IEEE Transactions on Antennas and Propagation, 2016, pp. 761-766, vol. 64, No. 2, IEEE.

Thomas et al., "A 45% PAE pMOS Power Amplifier for 28GHz Applications in 45nm SOI", 2018 IEEE 61st International Midwest Symposium on Circuits and Systems (MWSCAS), 2018, pp. 680-683, IEEE.

* cited by examiner

METHOD FOR ENHANCING POWER AMPLIFIER EFFICIENCY AND LINEARITY AND POWER AMPLIFIER

PRIORITY CLAIM AND REFERENCE TO RELATED APPLICATION

The application claims priority under 35 U.S.C. § 119 and all applicable statutes and treaties from prior provisional application Ser. No. 62/880,320, which was filed Jul. 30, 2019.

FIELD

A field of the invention is power amplification. A power amplifier of the invention has an example application to wireless transmitters, including 5G mm-wave transmitters.

ABBREVIATIONS

The following abbreviations are used in the text and the following meanings are accorded the abbreviations.
AM-AM Amplitude-to-Amplitude Modulation
AM-PM Amplitude-to-Phase Modulation
CMOS Complementary Metal-Oxide-Semiconductor
FET Field Effect Transistor
DPD Digital Predistortion
IQ In-Phase and Quadrature
LDMOS Laterally Diffused Metal-Oxide-Semiconductor
LMR Load Modulation Ratio
MOS Metal-Oxide-Semiconductor
PA Power Amplifier
PAPR Peak-to-Average Power Ratio
pHEMT Pseudomorphic High Electron Mobility Transistor
RF Radio Frequency
SiGe HBT Silicon Germanium Heterjunction Bipolar Transistor
SOI Silicon-on-Insulator

BACKGROUND

Low distortion levels are required for spectrally efficient complex modern communication signals with high PAPR. This necessity of low distortion puts strict requirements on the linearity of wireless transmitters. Average efficiency, mostly determined by the PA performance at peak and back-off power levels, is another significant criterion, particularly for battery powered devices. For emerging 5G applications employing mm-wave phased-arrays with multiple PA units on the same die, the importance of linearity and efficiency escalate further, since implementing individual DPD for each unit is not practical and heating of the PAs, densely placed next to each other, can be a problem. Therefore, the PA units must be inherently linear and efficient.

State-of-the-art techniques for power amplifier design together with their advantages and disadvantages are listed below.
Class-AB PA
  Advantages: High peak efficiency, small footprint, good AM-AM (bias dependent)
  Disadvantages: Low back-off efficiency, AM-PM issues that can be addressed by backing off the power (reducing the efficiency even further).
Envelope Tracking
  Advantage: High average efficiency.
  Disadvantages: Requires heavy DPD, does not work well for wide band modulated signals.
Doherty
  Advantages: High average efficiency, single RF input.
  Disadvantage: In practice typically requires DPD
Chireix outphasing
  Advantages: Very high average efficiency, low loss power combiner.
  Disadvantages: Typically requires two inputs, requires DPD.

Chireix outphasing [1] and Doherty [2], the two popular active load modulation techniques used at RF frequencies for PA efficiency enhancement, are currently being investigated for mm-wave applications. Both methods, in their original forms, utilize two PA cells connected to a non-isolating three port passive network, which serves as a power combiner and provides the desired load modulation during operation.

In theory, outphasing offers a better efficiency profile than Doherty [3], and in practice there are a variety of creative ways to implement the Chireix combiner with low loss (e.g., two-element L-C [4], offset transmission lines [5], on-antenna outphasing [6]-[7], and triaxial balun [8]). Also, in contrast to most Doherty implementations, the PA cells in outphasing have the same size, are biased similarly, and see the same magnitude of fundamental load modulation. These features make the dual-input implementations of outphasing [8] more advantageous than the dual-input implementations of Doherty (with analog [9]-[10] or digitally assisted mixed-signal [11] PAs) in that the two inputs for outphasing are symmetric (they have the same amplitude with opposite phases, i.e., complex conjugate in base-band signal domain).

On the other hand, a major advantage of the Doherty architecture, which has historically made it a more common choice than outphasing, is the simplicity of implementing its input signal splitter that feeds the two PA cells from a single RF input source, without the need for an extra IQ modulator and the bandwidth expansion problem associated with dual-input realizations.

In recent years, there have been successful proposals for novel architectures within the Doherty-outphasing continuum, in order to garner the best advantages of both methods in one circuit [12]-[13]. The primary emphasis in these works has been placed on efficiency improvement for single RF input amplifiers, leaving the linearity to be addressed with DPD.

REFERENCE LIST

The following publications are reference with numbers in brackets above and in the detailed description:
[1]—H. Chireix, "High power outphasing modulation," Proc. IRE, vol. 23, no. 11, pp. 1370-1392, November 1935.
[2]—W. H. Doherty, "A new high efficiency power amplifier for modulated waves," Proc. Inst. Radio Eng., vol. 24, no. 9, pp. 1163-1182, September 1936.
[3]—D. Calvillo-Cortes and L. de Vreede, "Analysis of pure- and mixed-mode class-B outphasing amplifiers," in Proc. IEEE Latin American Symp. Circuits and Systems, 2014, pp. 1-4.
[4]—S. Lee and S. Nam, "A CMOS outphasing power amplifier with integrated single-ended Chireix combiner," IEEE Trans. Circuits Syst. II, vol. 57, no. 6, pp. 411-415, June 2010.

[5]—W. Gerhard and R. Knoechel, "Improved design of outphasing power amplifier combiners," in Proc. German Microw. Conf., March 2009, pp. 1-4.

[6]—F. P. van der Wilt, E. Habekotte, and A. B. Smolders, "A non-isolated power-combining antenna for outphasing radio transmitters," IEEE Trans. Antenna and Propagation., vol. 64, no. 2, February 2016.

[7]—S. Li, T. Chi, J. Park, H. Nguyen, and H. Wang, "A 28-GHz flip-chip packaged Chireix Transmitter with on-antenna outphasing active load modulation," IEEE J. Solid-State Circuits, vol. 54, no. 5, pp. 1243-1253, May 2019.

[8]—B. Rabet and J. Buckwalter, "A high-efficiency 28 GHz outphasing PA with 23 dBm output power using a triaxial balun Combiner", in IEEE Int. Solid-State Circuits Conf. (ISSCC) Dig. Tech. Papers, February 2018, pp. 174-176.

[9]—N. Rostomyan, M. Ozen and P. Asbeck, "A Ka-band asymmetric dual input CMOS SOI Doherty power amplifier with 25 dBm output power and high backoff efficiency", in Proc. IEEE Power Amplifiers Wireless Radio Appl. (PAWR), January 2019.

[10]—C. S. Levy, V. Vorapipat, J. F. Buckwalter, "A 14-GHz 22-dBm series Doherty power amplifier in 45-nm CMOS SOI", Proc. IEEE Compound Semiconductor Integr. Circuit Symp. (CSICS), pp. 1-4, October 2016.

[11]—F. Wang, T. Li, and H. Wang, "A highly linear super-resolution mixed-signal Doherty power amplifier for high-efficiency mm-wave 5G multi-Gb/s communications", in IEEE Int. Solid-State Circuits Conf. (ISSCC) Dig. Tech. Papers, February 2019, pp. 88-90.

[12]—D. Martin, T. Cappello, M. Litchfield, and T. Barton, "An X-band RF-input outphasing power amplifier", 2018 IEEE Int. Microw. Symp., pp. 308-311.

[13]—H. Jang, R. Wilson, T. Canning, D. Seebacher, C. Schuberth, B. Arigong, F. Trang, and S. Ward, "RF-input self-outphasing Doherty-Chireix combined amplifier" IEEE Trans. Microw. Theory Techn., vol. 64, no. 12, pp. 4518-4534, December 2016.

[14]—F. Raab, "Efficiency of outphasing RF power-amplifier systems," IEEE Trans. Commun., vol. COM-33, no. 10, pp. 1094-1099, October 1985.

[15]—N. Rostomyan, M. Ozen and P. Asbeck, "28 GHz Doherty power amplifier in CMOS SOT with 28% back-off PAE", IEEE Microw. Wireless Compon. Lett., vol. 28, no. 5, pp. 446-448, May 2018.

[16]—N. Rostomyan, M. Ozen, and P. Asbeck, "Comparison of pMOS and nMOS 28 GHz high efficiency linear power amplifiers in 45 nm CMOS SOT," in Proc. IEEE Power Amplifiers Wireless Radio Appl. (PAWR), January 2018, pp. 26-28.

[17]—D. Thomas, N. Rostomyan, and P. Asbeck, "A 45% PAE pMOS power amplifier for 28 GHz applications in 45 nm SOT," in Proc. IEEE Int. Midwest Symp. Circuits Syst., August 2018, pp. 680-683.

[18]—J. Jayamon, J. Buckwalter, and P. Asbeck, "Multigate-cell stacked FET design for millimeter-wave CMOS power amplifiers," IEEE J. Solid-State Circuits, vol. 51, no. 9, pp. 2027-2039, September 2016.

[19]—P. Asbeck, N. Rostomyan, M. Ozen, B. Rabet, and J. Jayamon, "Power amplifiers for mm-wave 5G applications: technology comparisons and CMOS-SOI demonstration circuits," IEEE Trans. Microw. Theory Techn., vol. 67, no. 7, pp. 3099-3109, July 2019.

[20]—S. Shakib, H. Park, J. Dunworth, V. Aparin, and K. Entesari, "A 28 GHz efficient linear power amplifier for 5G phased arrays in 28 nm bulk CMOS," in IEEE Int. Solid-State Circuits Conf. (ISSCC) Dig. Tech. Papers, January 2016, pp. 352-353.

[21]—S. Shakib, M. Elkholy, J. Dunworth, V. Aparin, and K. Entesari, "A wideband 28 GHz power amplifier supporting 8×100 MHz carrier aggregation for 5G in 40 nm CMOS," in IEEE Int. Solid-State Circuits Conf. (ISSCC) Dig. Tech. Papers, February 2017, pp. 44-45K

SUMMARY OF THE INVENTION

A preferred embodiment is a method for power amplification which uses circuitry including a main amplifier and an auxiliary amplifier that are constructed and operate such that an input is applied to the main and auxiliary amplifiers via an input network. At low power levels, the auxiliary amplifier is off and the main amplifier sees a large impedance. At maximum power level, both the auxiliary and main amplifiers operate at full power and there is a constant phase shift between them. While transitioning from low to maximum power, systematic AM-AM and AM-PM variations are generated (due to the phase shift provided by the input network, bias differences between the main and auxiliary amplifiers, and nature of the output combiner) to compensate device related distortions.

A preferred power amplifier includes an input and a split to apply the input to a main amplifier and an auxiliary amplifier with a phase shift. At low power levels the auxiliary amplifier is off and the main amplifier sees a large impedance. At maximum power level both the auxiliary and main amplifiers operate at full power and there is a constant phase shift between them. In one design, the main amplifier comprises a class-AB amplifier and the auxiliary amplifier comprises a class-C amplifier. In another design, the main amplifier comprises a class-AB amplifier and the auxiliary amplifier uses a power-level dependent bias voltage that changes its mode of operation continuously from class-C to class-AB. The input and output networks are designed so that while transitioning from low to maximum power, systematic AM-AM and AM-PM variations are generated to compensate device-related distortions.

DETAILED DESCRIPTION OF THE PREFERRED EMBODIMENTS

Preferred embodiments of the invention provide methods for simultaneously improving the back-off efficiency and linearity of PAs. A preferred embodiment amplifier uses a combination of Chireix outphasing and Doherty architectures, and requires a single RF input with no predistortion. A preferred amplifier circuit consists of a dual-input high-efficiency outphasing PA and an input network, which serves as a power splitter and feeds the inputs of the main and auxiliary PA cells (amplifiers) that are biased in class-AB and class-C regions respectively. In preferred embodiments phase distortion at the output is minimized by a balance between the device-induced phase distortion as the power level varies, and the systematic phase variation is created by passive input and output networks and operation of main and auxiliary amplifiers. The systematic phase variation varies the output phase as the auxiliary amplifier output power increases.

A preferred experiment embodiment demonstrated an integrated high-efficiency 28 GHz power amplifier (PA) employing a combination of Chireix outphasing and Doherty architectures in order to simultaneously achieve power back-off efficiency and linearity with a single RF input signal and no predistortion. A preferred amplifier includes and preferably consists of a dual-input high-efficiency outphasing PA and an input network that serves as a power splitter and feeds the same signal to the inputs of main and auxiliary PA cells that are biased in class-AB and class-C regions respectively, similar to the Doherty architecture. The operation of the PA cells together with the Chireix combiner result in back-off efficiency enhancement plus systematic AM-AM and AM-PM variations which are used to correct the distortions caused by transistors, resulting in a linear response. A prototype implemented PA demonstrates 19 dBm saturation power (Psat) with 34.4% peak power-added efficiency (PAE) and 6-dB back-off PAE of >23% at 27.5 GHz. The modulated signal performance using a 100 MHz 64-QAM OFDM signal shows average output power of 11.9 dBm with PAE>20%, EVM<5%, and ACLR<−33 dBc without using predistortion. Such performance, to the authors' best knowledge, is among the highest PAE reported to date for an OFDM signal without DPD (or other forms of digital enhancement) at power levels of interest for 5G transmitters.

Preferred amplifiers and methods improve back-off efficiency, only require a single RF input, while also correcting the nonlinearity of the PA cells to eliminate the need for predistortion. Preferred amplifiers utilize a Chireix combiner, and can be referred to as a Single Input Linear Chireix (SILC) PA.

Preferred embodiments of the invention will now be discussed with respect to the drawings and experiments used to demonstrate the invention. The drawings may include schematic representations, which will be understood by artisans in view of the general knowledge in the art and the description that follows.

Figure 1:
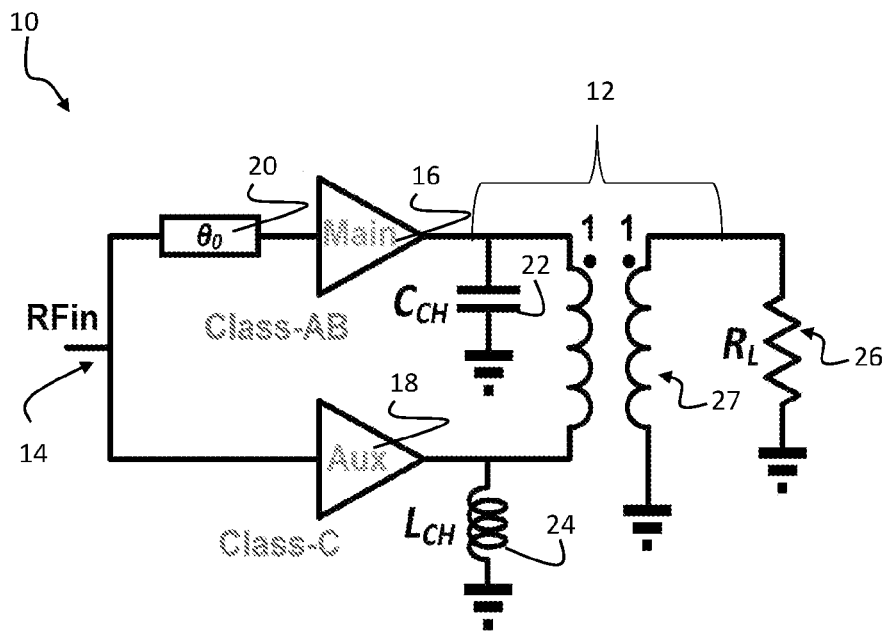
FIG. 1 shows a preferred architecture for a power amplifier of the invention.

FIG. 1 shows a preferred architecture for a power amplifier 10 of the invention. It includes a Chireix combiner 12 and a split 14 of an RF input ($RF_{in}$) into separate signals to be amplified by a main amplifier 16 and an auxiliary amplifier 18. In one path is a delay line 20. The main and auxiliary amplifiers 16 and 18 are biased with Doherty-like biases (class-AB main and class-C auxiliary) and outputs of these amplifiers are applied to input ports of the combiner 12. The delay line 20 is an input network providing a constant phase shift ($\theta_0$) to path to the main amplifier 16. Depending on the type of the Chireix combiner and characteristics of the PA cells, the delay line can be placed at the input of either amplifier for proper operation. The Chireix combiner can be made differential (using a balun as in FIG. 1), or common mode like a Wilkinson combiner. The PA cells' AM-PM distortion can be positive (leading) or negative (lagging). In the power amplifier 10, the main amplifier 16 is a class-AB amplifier and the auxiliary amplifier 18 is a class-C amplifier. The auxiliary amplifier 18 can also be an amplifier that uses a power-level dependent bias voltage that causes it to operate in a mode that changes continuously between class-C and class-AB. The difference between Class-AB and Class C operation is the bias voltage applied to the gate of the amplifier. In one example, the bias voltage of the peaking amplifier is held constant at a value corresponding to class-C operation. In another example, the bias voltage of the peaking amplifier is changed from an initial value corresponding to Class-C, but as the power level increases, the bias voltage is continuously shifted to correspond to Class-AB operation. The main and auxiliary amplifiers 16 and 18 can be considered to be current sources, and the shunt compensating elements 22 and 24 of the combiner 12 with susceptances of $\pm B_{CH}$ ($C_{CH}$ and $L_{CH}$) are chosen in accordance with outphasing principles, such as those described in [14]. A load 26 is connected to the third port of the combiner 12 provided by its transformer 27. An output network is formed by the combiner 12 (including 22 and 24). Additional circuit elements for impedance matching and for power combining of the two branches can be added to the output network for particular designs.

At low input power levels (below the back-off peak efficiency point) the auxiliary amplifier 18 is off, the main amplifier 16 operates as a standalone class-AB PA. As an example, low power can be more than 4-5 dB back-off from maximum usable power. A conventional Doherty design in principle uses 6 dB back-off from maximum power for the transition point between low and high power modes of operation. Maximum power can be considered the absolute highest power (saturated power) of the amplifier output. In practice, the maximum usable power for applications is the maximum "linear" power, where the gain has dropped off from its low power value by no more than for example 1 dB, if no digital gain correction techniques is to be used.

Figure 2A:
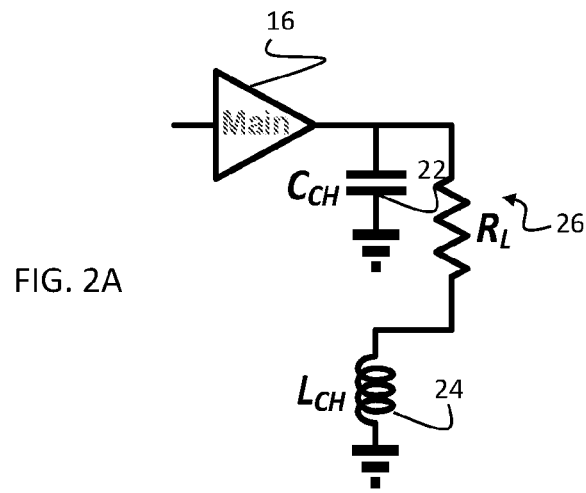
FIG. 2A shows an equivalent circuit of the FIG. 1 PA for low power mode operation when the auxiliary amplifier is off.
Figure 2B:
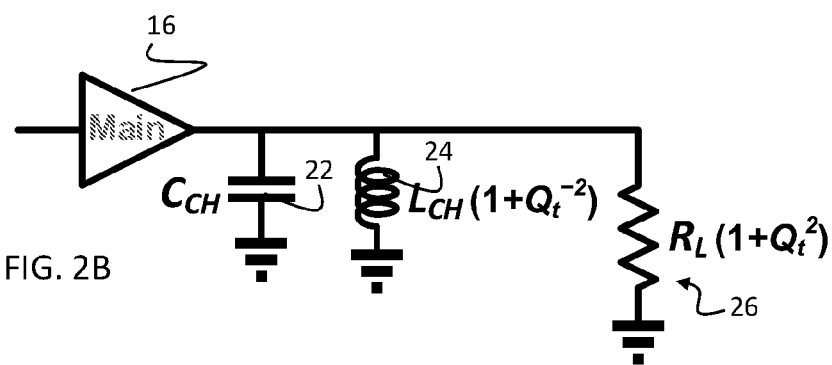
FIG. 2B shows equivalent series-to-parallel transformation of the circuit in FIG. 2A.

Examples to be discussed include three different designs. For each one, the auxiliary amplifier 18 kicks in at a different back-off power level, which is captured by the "back-off peak efficiency point", with the specific dB number discussed below. The equivalent circuit for the low input power level mode of operation is shown in FIG. 2A. The load impedance seen by the main PA 16 at low power ($Z_A$) can be calculated by performing a series-to-parallel impedance transformation, as shown in FIG. 2B. The quality factor of this transformation ($Q_t$) is equal to inverse of $B_{CH}R_L$, which is a design parameter for Chireix combiners determining the back-off efficiency profile of the outphasing PAs. For example, $B_{CH}R_L$ equal to 0.6 and 0.86 result in back-off peak efficiency points at 10 dB and 6 dB respectively, therefore $Q_t$ is typically a value in the 1.16-1.66 range. Additionally, $C_{CH}$ is tuned out, although not completely, by the resulting parallel inductance, keeping the reactive part of the load impedance low for high efficiency. The residual capacitance, $C_{CH}/(1+Q_t^2)$, causes modest efficiency and gain reduction due to a non-unity power factor ($PF_A$) ranging between 0.75 and 0.85. Equation (1) shows the relation between the $PF_A$ and $Q_t$:

$$PF_A = \frac{\text{real}\{Y_A\}}{|Y_A|} = \frac{\frac{1}{R_L(1+Q_t^2)}}{\sqrt{\left(\frac{1}{R_L(1+Q_t^2)}\right)^2 + \left(\frac{B_{CH}}{1+Q_t^2}\right)^2}} \tag{1}$$

$$= \frac{1}{\sqrt{1+(B_{CH}R_L)^2}} = \frac{Q_t}{\sqrt{1+Q_t^2}}.$$

The power amplifier 10 is preferably designed such that the auxiliary amplifier 18 is biased to remain off up to the input power where the main amplifier 16 starts saturating and exhibits nonlinear behaviors including gain compression and AM-PM distortion. In principle, the efficiency should reach its maximum class-AB value scaled by $PF_A$ (0.75-0.85), and the gain should be lower than the class-AB gain by $PF_A/2$ (3.7-4.25 dB). The extra ½ for the gain ratio is due to the fact that in this mode of operation the input power going to the auxiliary amplifier is wasted.

As the auxiliary amplifier 18 turns on and begins providing power, a variety of mechanisms influence the output, of which some are due to the topology itself (i.e., load modulation, systematic AM-AM and AM-PM variations), some are due to the device non-idealities (i.e., gain compression and AM-PM distortion), and some result from combination of both topology and device non-idealities (i.e., self-outphasing).

The end point of this region, where the power amplifier 10 provides its highest output power, is considered first. Both amplifiers work with their full power at this point, with a constant phase-shift ($\theta$) between them, resulting from the delay line at the input network ($\theta_0$), as well as phase imbalance ($\theta_1$) coming from the non-equal input impedances of the main 16 and auxiliary 18 amplifiers due to their bias difference ($\theta=\theta_0+\theta_1$). If a standard combiner is used, this operation point can be designed to lie in a high-efficiency area (PF=1) of the impedance trajectories provided by the Chireix method [5] shown in the Smith chart of FIG. 3. There are two candidates for this point, one close to the center of the Smith chart with a lower impedance value associated with higher output power, and the other one at "outphasing back-off," providing higher load impedance appropriate for low power operation. The design parameter that determines the impedance of choice is the phase shift $\theta$ between the two amplifiers.

For standard outphasing operation, equal fundamental voltage amplitudes are required at the input ports of the Chireix combiner 12 provided from outputs of the main 16 and auxiliary 18 amplifiers. This approach is also followed here at full power; since the auxiliary amplifier 18 is biased in class-C and has lower gain than the main amplifier 16, it is set to have a higher supply voltage than the main amplifier 16 in order to match the voltage swings at maximum power.

Simulations were conducted to test alternative design approaches of the circuit in FIG. 1, achieved by changing the value of the input phase shift 20 and bias of the auxiliary amplifier 18. The simulations were conducted with an idealized transistor model (voltage-controlled current source (VCCS) with knee voltage an ideal balun. A mathematically defined two-port network was used to create the transistor model as a VCCS with a knee voltage. The set of conditions and equations that are used to define the transistor-like behavior are given in (1a):

$$\begin{cases} I_1 = 0 \\ \text{if } [(V_1 - V_{th}) \le 0] \text{ or } [V_2 \le 0] \text{ then } I_2 = 0 \\ \text{else } I_2 = gm \times (V_1 - V_{th}) \times \frac{\arctan(V_2/\alpha)}{\pi/2} \end{cases} \tag{1a}$$

Figure 3:
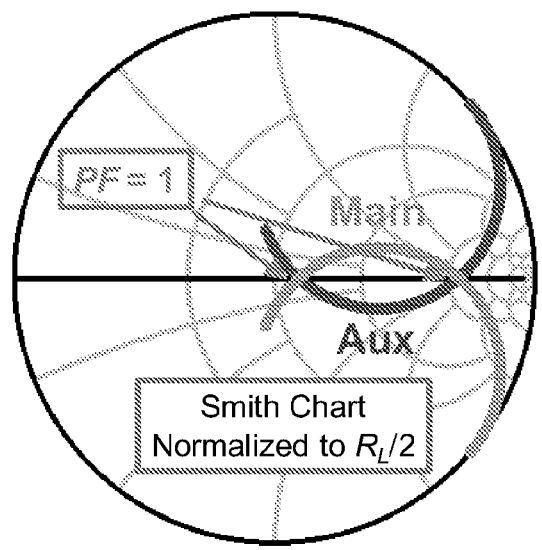
FIG. 3 is a Smith chart of impedance trajectories for setting an operation point of the FIG. 1 PA in a high efficiency area.
Figure 4A:
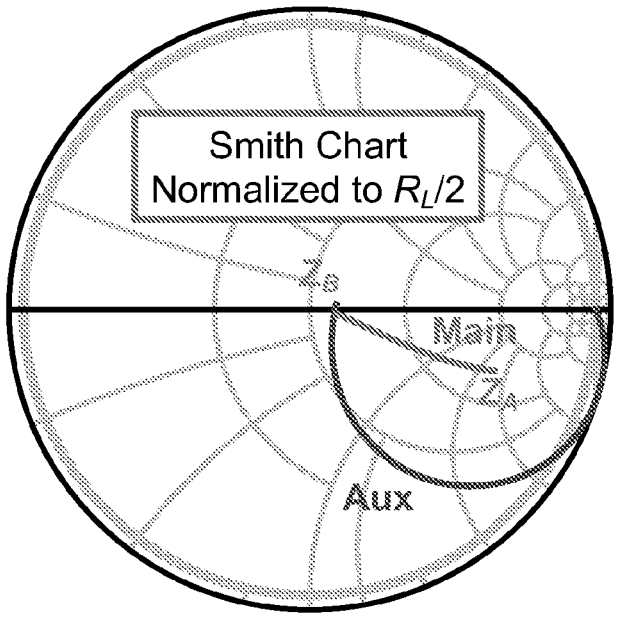
FIG. 4A shows the impedance trajectories seen by the main and auxiliary amplifiers for a preferred design PA consistent with FIG. 1.

FIG. 4A shows the impedance trajectories seen by the main 16 and auxiliary 18 amplifiers for a preferred design, where the end point impedance at maximum power is chosen to be the lower value of the two options shown in FIG. 3 with PF=1. With $B_{CH}R_L$ of 0.8 ($Q_t$=1.25), the fixed phase-shift between the amplifiers is calculated accordingly based on the standard Chireix equations [5] ($\theta=\sin^{-1} B_{CH}R_L=\sin^{-1} Q_t^{-1}=126.9°$). Theory predicts that the trajectory of impedance seen by the main amplifier starts at:

$$Z_A = [R_L(1+Q_t^2)] \| \left[\frac{1+Q_t^2}{jB_{CH}}\right] = R_L(Q_t^2 - jQ_t) \tag{2}$$

and ends at $$Z_B = R_L Q_t^2 (1 - \sqrt{1-Q_t^{-2}}) = \frac{R_L}{2\cos^2\frac{\theta}{2}}. \tag{3}$$

Figure 4B:
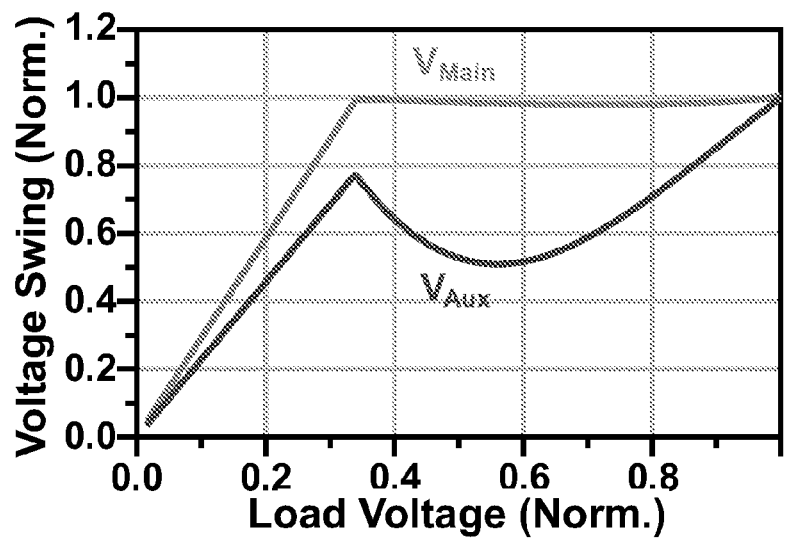
FIGS. 4B-4C show simulation results for voltage swing and efficiency for the FIG. 4A design.
Figure 4C:
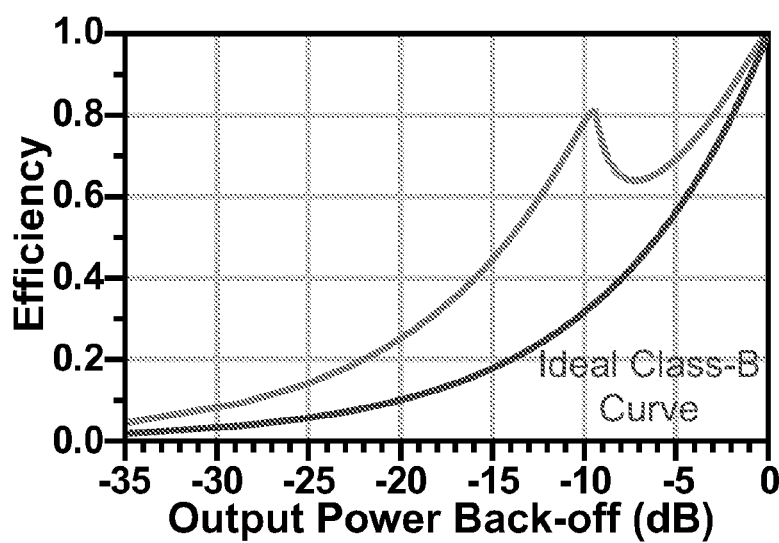

These values are supported by the simulation results shown in FIG. 4B. The output power variation due to LMR for the main amplifier 16 is $$LMR_{Main} = \frac{\text{Real}\left\{\frac{1}{Z_B}\right\}}{\text{Real}\left\{\frac{1}{Z_A}\right\}} = (1+Q_t^2)(1+\sqrt{1-Q_t^{-2}}) \tag{4}$$

which corresponds to 4.1 (6.1 dB) in this design. For the overall output power, the contribution of the auxiliary amplifier 18 is then taken into account, by doubling the value for the main amplifier (adding 3 dB), since at the maximum power both amplifiers see the same impedance (FIG. 4A) and have the same output voltage swing (FIG. 4B). The back-off peak efficiency is therefore expected to be at a power level 9.1 dB below the maximum power with a value reduced by $PF_A$ (0.78) relative to the peak efficiency. These numbers are in good agreement with the simulations shown in FIG. 4C. The slight difference between the theory and simulation is due to the presence of knee voltage and saturation of the PA cells (main 16 and auxiliary 18 amplifiers). In FIG. 4A, the impedance seen by the auxiliary amplifier 18 goes outside of the smith chart for a small region at the beginning of its operation. This condition is not an indicator of instability; it only shows that a small portion of the power generated by the main amplifier 16 is consumed by the auxiliary amplifier 18.

These results are favorable in terms of efficiency. Linearity must be addressed as well in order to achieve a design that does not require DPD. The goal is to have systematic AM-AM and AM-PM changes that are in the opposite direction of the gain compression and AM-PM variation caused by the device non-idealities, so that the overall response is distortion free. For an overdriven amplifier, the gain compression characteristics and resultant AM-AM distortion are in general dependent on the choice of power transistor (SiGe HBT, CMOS, LDMOS, pHEMT) and bias conditions. The corresponding AM-PM distortion, associated with the change of device input and output capacitance as well as the impedance matchings, is often a critical determinant of the overall amplifier linearity in this regime. Systematic AM-AM and AM-PM changes are provided that are in the opposite direction of gain compression and AM-PM variation caused by device non-idealities. A preferred approach increases output power of the auxiliary amplifier 18 at an appropriate rate, and systematic AM-PM variation is caused by the input phase shift 20 between the input paths to the main 16 and auxiliary 18 amplifiers. Systemic AM-AM and AM-PM variation can be produced using phase shifts between main and auxiliary paths and adjusting the bias voltages of the amplifiers to meet linearity specifications without applying digital predistortion or any other correction to the input. The appropriate rate of power increase for the auxiliary amplifier vs input power is that which keeps the overall amplifier gain constant vs output power level. This appropriate rate produces a systematic AM-AM variation that cancels the device-dominated AM-AM distortion.

The net amount of systematic AM-AM results from two features. The first one is the $PF_A/2$ ratio that was mentioned above. In contrast to the low power mode of operation, at high power the power factor rises to unity and the input power going to the auxiliary amplifier 18 is not wasted, therefore the gain increases by $2/PF_A$. The second feature is that the load modulation decreases the gain, if the gm is considered to be constant for the PA cells. This gain variation is captured by looking at the change in the magnitude of impedance seen by the main amplifier 16 ($|Z_A|/|Z_B|$), thus the overall systematic AM-AM can be calculated as shown below.

$$\text{Systematic } AM-AM = \frac{2}{PF_A} \times \frac{|Z_B|}{|Z_A|} = 2\times\left(1 - \sqrt{1 - Q_t^{-2}}\right) \quad (5)$$
$$= 4\sin^2\frac{\theta}{2}$$

Figure 4D:
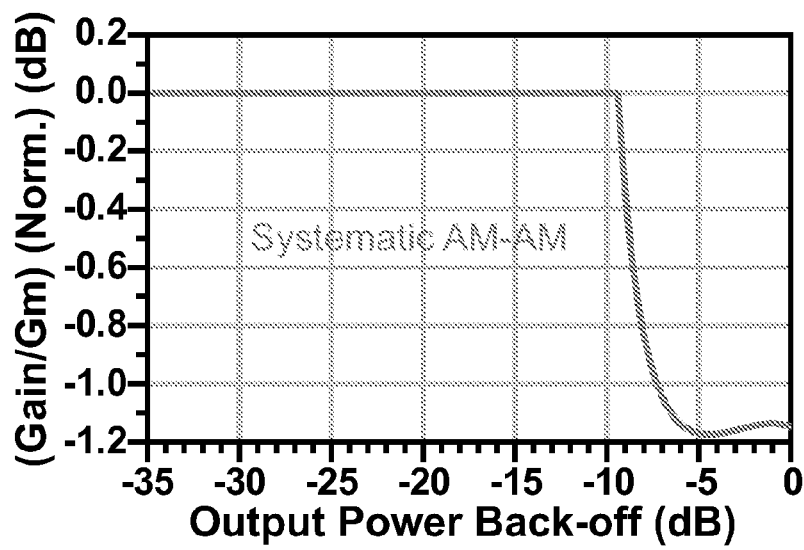
FIGS. 4D-4E show simulation results for systematic AM-AM and AM-PM variations during output power back-off.

Equation (5) in this example, results in ~−1 dB, meaning that for a design with low value impedance at peak power, the systematic AM-AM aggravates the device gain compression problem rather than fixing it. In order to capture the systematic AM-AM in simulation, the variation of large signal transconductance (Gm) is de-embedded from overall gain variation, as shown in FIG. 4D.

Figure 5:
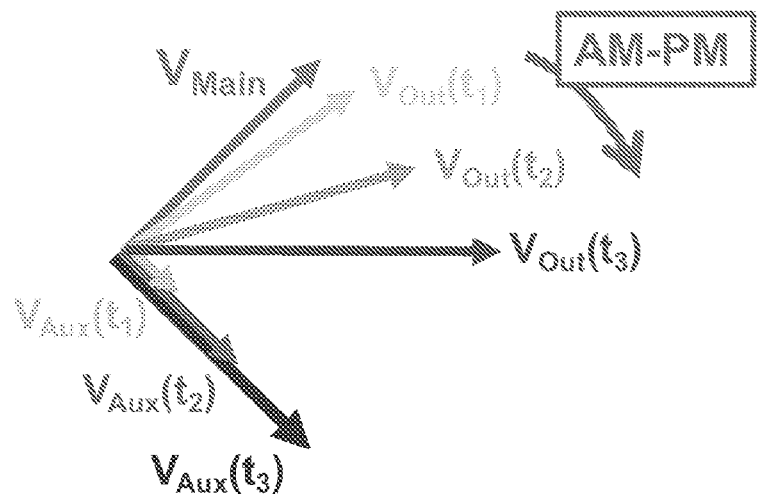
FIG. 5 shows a simplified phasor diagram illustrating the output voltages for the FIG. 4A design.

Systematic AM-PM and the mechanism that causes it are described by looking at the three combiner port voltages (voltages at outputs of main and auxiliary amplifiers and at the load). FIG. 5 shows a simplified phasor diagram illustrating the output voltages of the main ($V_{Main}$) 16 and auxiliary ($V_{Aux}$) 18 amplifiers as well as the load voltage ($V_{Out}$). A vector sum (instead of subtraction) is depicted here for the sake of convenience, even though the actual combiner is differential. We use the simplifying assumptions that $V_{Main}$ and the phase difference between the two vectors ($\theta$) stay constant in this region. As $V_{Aux}$ increases, the magnitude and phase of $V_{Out}$ vary simultaneously, and it is clear from FIG. 5 that the overall amount of this systematic AM-PM is equal to half of $\theta$, because eventually $V_{Aux}$ approaches the same magnitude as $V_{Main}$. In reality, the assumptions made here are not accurate, because the main and auxiliary amplifiers see reactive loads in the middle points (FIG. 4A). However, since at the end point both of them see a purely resistive impedance, the overall systematic AM-PM change captured by this analysis, as given by (6), remains a very good approximation.

$$\text{Systematic } AM-PM \cong \frac{\text{total input phase shift}(\theta)}{2} = \frac{\sin^{-1}Q_t^{-1}}{2} \quad (6)$$

Figure 4E:
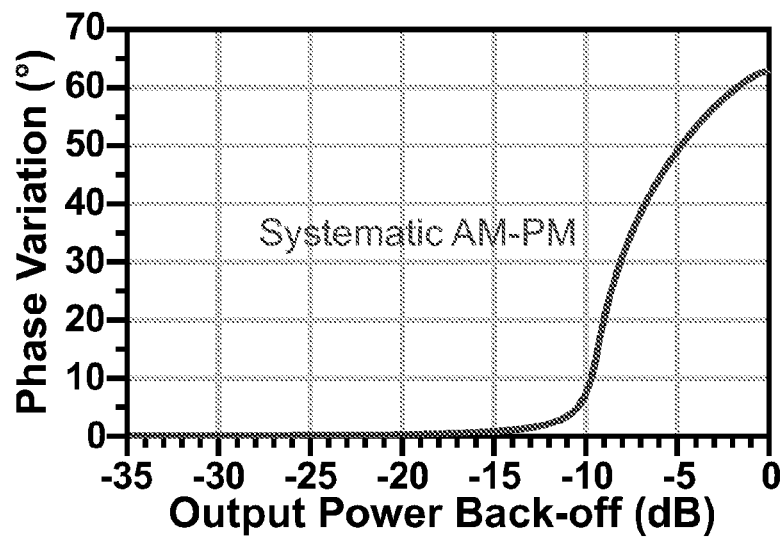

The simulation result shown in FIG. 4E verifies this analytical approach. The AM-PM obtained in this example is not particularly favorable for an overall linear amplifier, because the relatively large amount (~50 degrees over a 5 dB power variation and ~63 degrees in total) is significantly greater than typical device-related phase distortions.

Figure 4F:
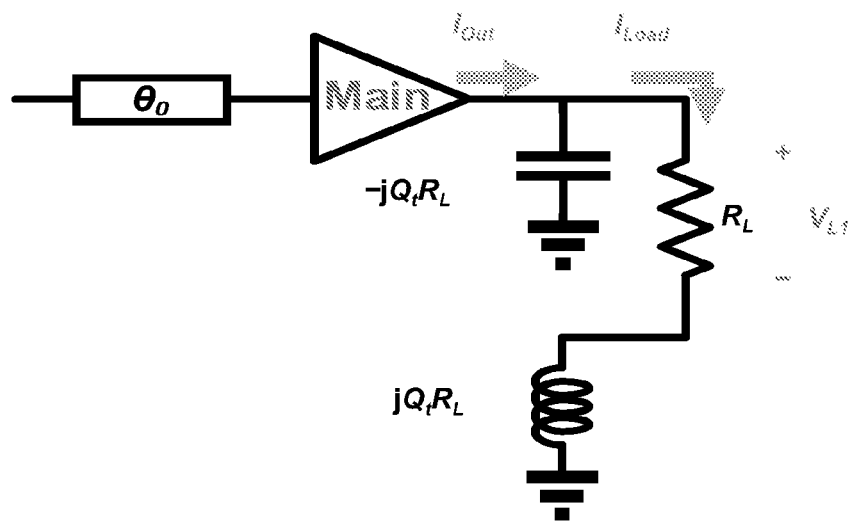
FIG. 4F shows an equivalent circuit of the FIG. 4A design at low power when the auxiliary amplifier is off and FIG. 4G the equivalent circuit at peak power.

The systematic AM-PM calculation was conducted as follows. In order to calculate the systematic AM-PM, the phase of the load voltage at low power ($V_{L1}$) and at peak power ($V_{L2}$) are subtracted from each other. FIG. 4F shows the equivalent circuit at low power when the auxiliary amplifier is off, with the corresponding currents annotated. It is obvious that the phase of $V_{L1}$ is the same as the phase of $i_{Load}$ in this mode of operation. By writing KVL and KCL at the output node of the main amplifier, it can be shown that $i_{Load}=i_{Out}\times(-jQ_t)$, and since $i_{Out}$ itself has 00 degrees delay, the phase of $V_{L1}$ is calculated to be $-(\theta_0+90°)$.

Figure 4G:
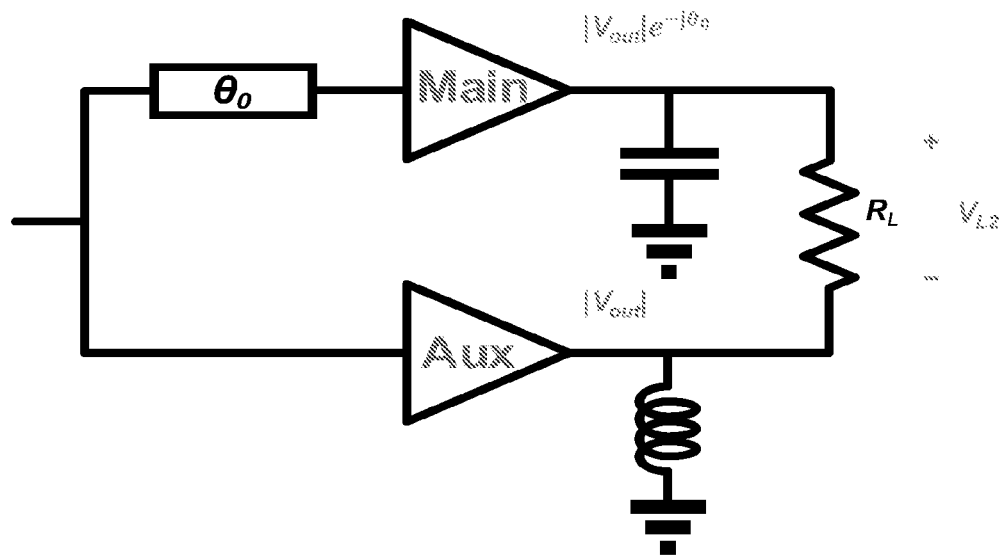

FIG. 4G shows the equivalent circuit at peak power. If the power amplifier is designed such that at this point the main 16 and auxiliary 18 amplifiers see a purely resistive (PF=1) impedance and have the same voltage swing ($|V_{Out}|$), $V_{L2}$ would be equal to $|V_{Out}|\times[\exp(-j\theta_0)-1]$. In that case, it can be shown that the phase of $V_{L2}$ is equal to $-(\theta_0/2+90°)$.

The FIG. 1 amplifier 10 with the phase shifts discussed above provides a remarkable back-off efficiency profile with a simple outphasing PA topology that has an asymmetric bias and a constant phase shift between the two input RF signals feeding the main 16 and auxiliary 18 amplifiers. Phase shift is chosen such that the load impedance at maximum power was relatively low (FIG. 3 point that is close to the center of the Smith chart with PF=1), and therefore the efficiency had a second peak at a deep back-off (see Eq (4)). Back-off peak efficiency happens at 9.1 dB in this example), but the linearity in terms of AM-AM and AM-PM is poor. The FIG. 1 design can be used for applications where pre-distortion is available. Modifications are preferred, however, for applications where inherent linearity is required.

Figure 6A:
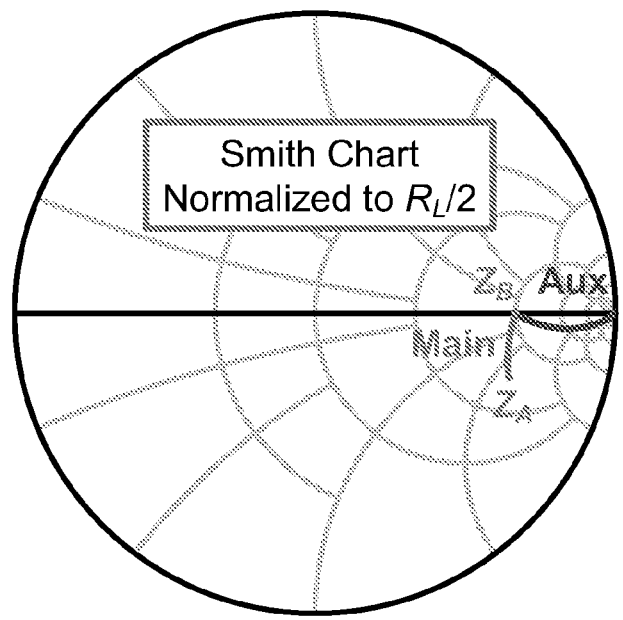
FIG. 6A shows the impedance trajectories seen by the main and auxiliary amplifiers for a preferred design PA consistent with FIG. 1.
Figure 6B:
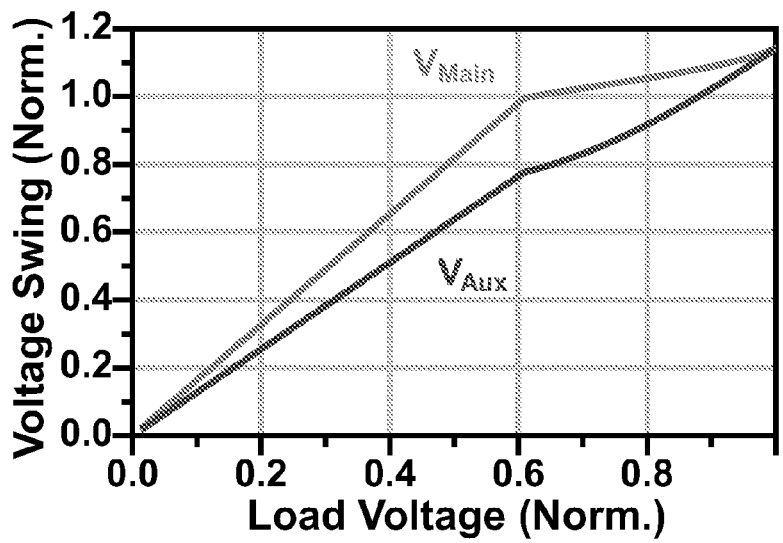
FIGS. 6B-6C show simulation results for voltage swing and efficiency for the FIG. 6A design.
Figure 6C:
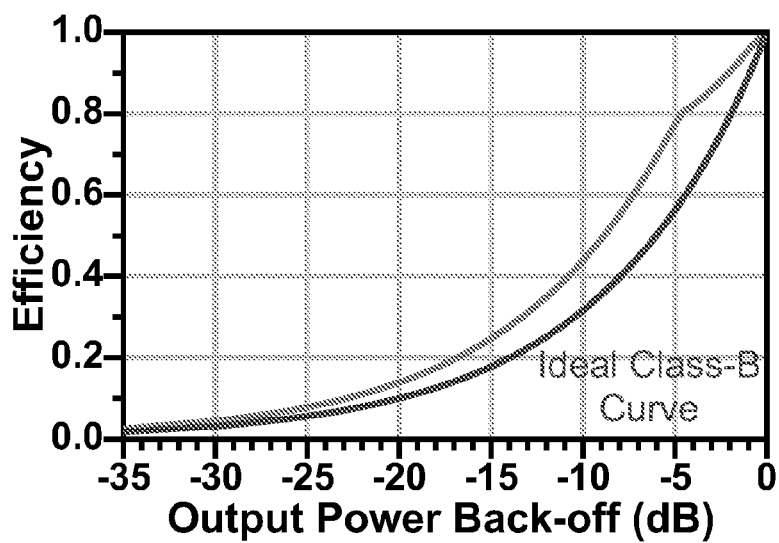
Figure 6D:
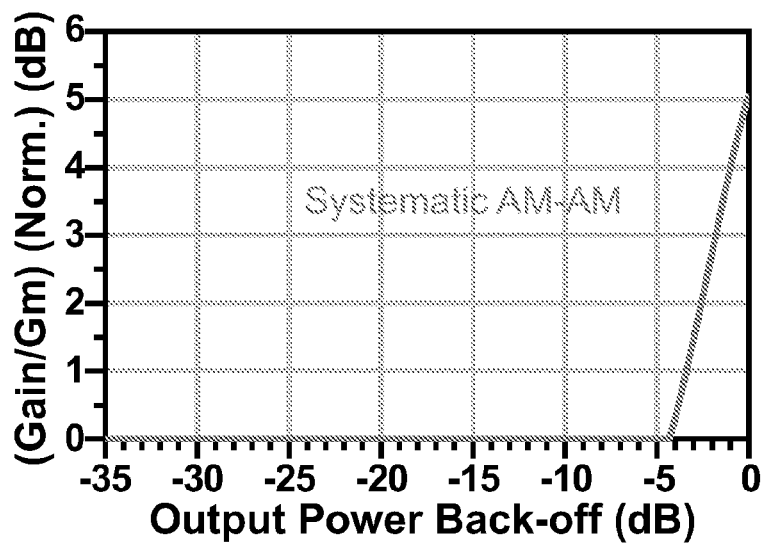
FIGS. 6D-6E show simulation results for systematic AM-AM and AM-PM variations during output power back-off.
Figure 6E:
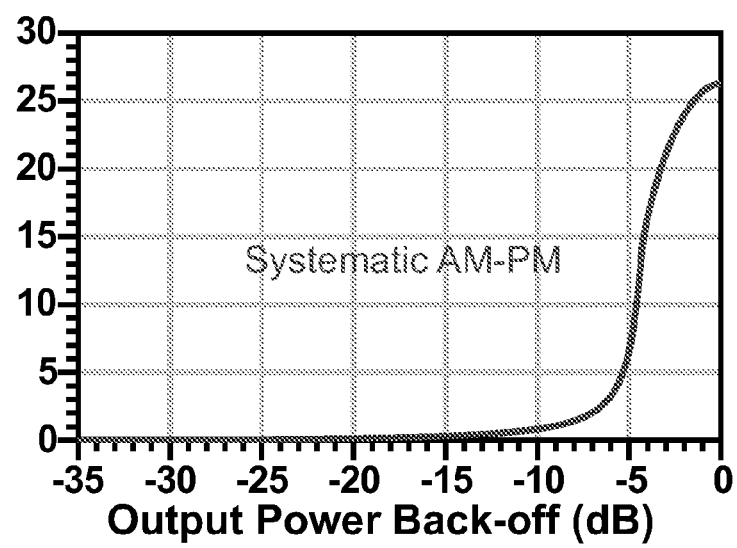

A similar design is now examined that at peak power has the higher impedance with unity power factor.

$$Z_B = R_L Q_t^2 \left(1 + \sqrt{1-Q_t^{-2}}\right) = \frac{R_L}{2\sin^2\frac{\theta}{2}} \quad (7)$$

achieved by changing the input phase shift to the other answer of the trigonometric equation $\theta = \sin^{-1} Q_t^{-1}$, which is 53.12° (for $B_{CH}R_L = 0.8$). The simulation results, obtained by using the same transistor model, are shown in FIGS. 6A-6E. Compared to the previous example, here the amount of load modulation for the main amplifier is minor (FIG. 6A) and $$LMR_{Main} = \frac{\text{Real}\left\{\frac{1}{Z_B}\right\}}{\text{Real}\left\{\frac{1}{Z_A}\right\}} = (1 + Q_t^2)\left(1 - \sqrt{1-Q_t^{-2}}\right) \quad (8)$$

is only 0.11 dB. Also, the output voltage of the main amplifier 16 continues to increase (deep saturation) even after the auxiliary amplifier 18 turns on (FIG. 6B). The efficiency profile, shown in FIG. 6C is not as good as the previous example, but it is still better than an ideal class-B shown in FIG. 6D and has a back-off peak at ~4.4 dB, with a value that is lower than the peak efficiency by $PF_A$ (0.78) as found for the previous case. Note that if the efficiency curve was plotted vs absolute power (rather than normalized power), the back-off efficiency peak would be at the exact same output power in both example designs, but the peak power would be different. The systematic AM-AM expression needs to be modified too, since $Z_B$ has increased. The new expression is $$\text{Systematic } AM - AM = \frac{2}{PF_A} \times \frac{|Z_B|}{|Z_A|} = 2 \times \left(1 + \sqrt{1-Q_t^{-2}}\right) \quad (9)$$
$$= 4\cos^2\frac{\theta}{2}$$

that results in ~5 dB (FIG. 6D), which can compensate the device related gain compression coming from the considerable amount of effective Gm reduction due to the deep saturation experienced by the main amplifier. The deep saturation of the main amplifier 16 can be avoided in a practical design by adjusting the bias condition of the auxiliary amplifier 18. The equation for the systematic AM-PM is same as (6) and results in ~26.6°. The simulation result shown in FIG. 6E is in good agreement with the calculation.

It is also possible to have an intermediate design between the two previous examples. As shown in FIG. 3, if a phase shift other than the two values suggested by $\theta = \sin^{-1} Q_t^{-1}$ is applied to the input signals, the peak power impedances seen by the main 16 and auxiliary 18 amplifiers will be complex conjugates of each other and not purely resistive ($Z_B$ and $Z_B^*$). As a result, the peak efficiency will drop slightly due to the non-unity power factor of $Z_B$ ($PF_B$), but other than that the PA will work in a manner similar to the previous examples.

Figure 7A:
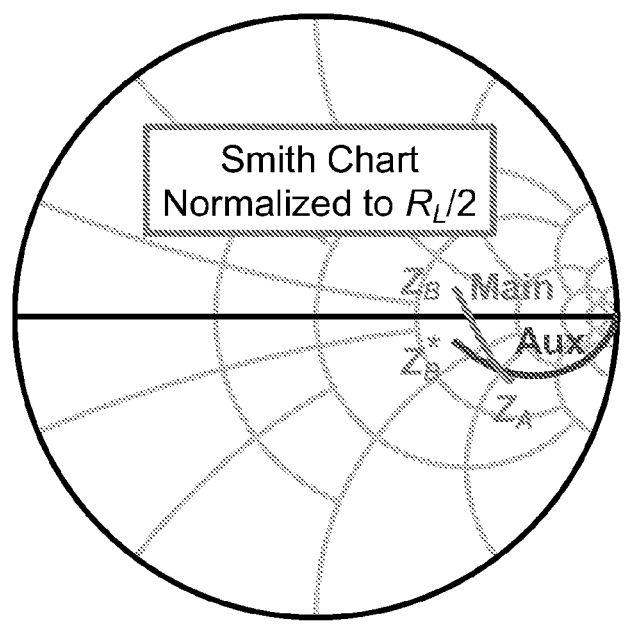
FIG. 7A shows the impedance trajectories seen by the main and auxiliary amplifiers for a preferred design PA consistent with FIG. 1 having a phase shift of 90° applied at the input.
Figure 7B:
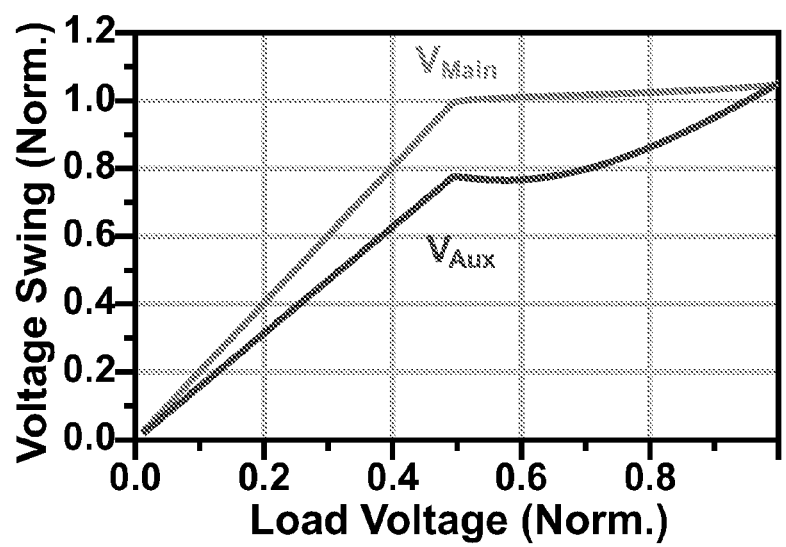
FIGS. 7B-C show simulation results for voltage swing and efficiency for the FIG. 7A design.
Figure 7C:
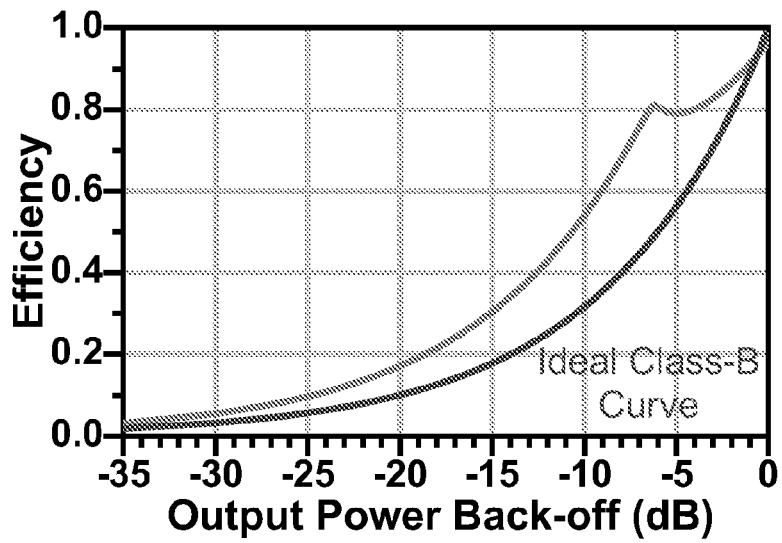
Figure 7D:
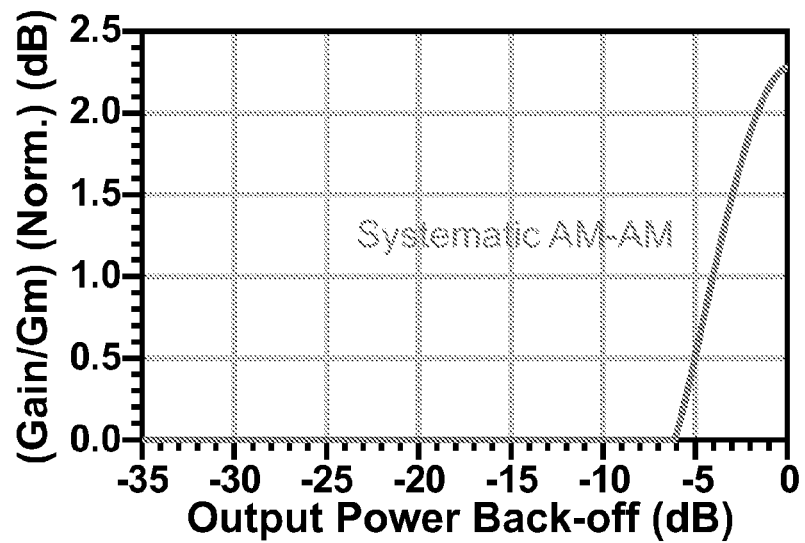
FIGS. 7D-7F show simulation results for systematic AM-AM and AM-PM variations during output power back-off.
Figure 7E:
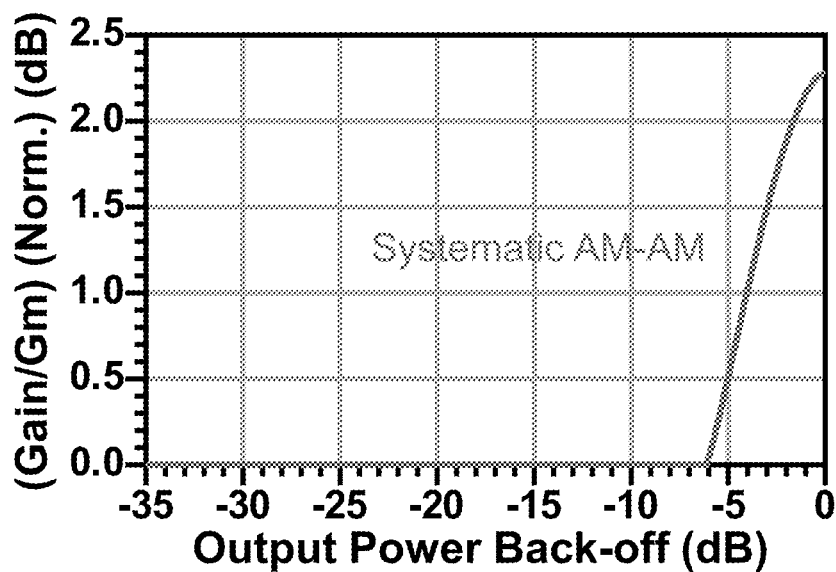
Figure 7F:
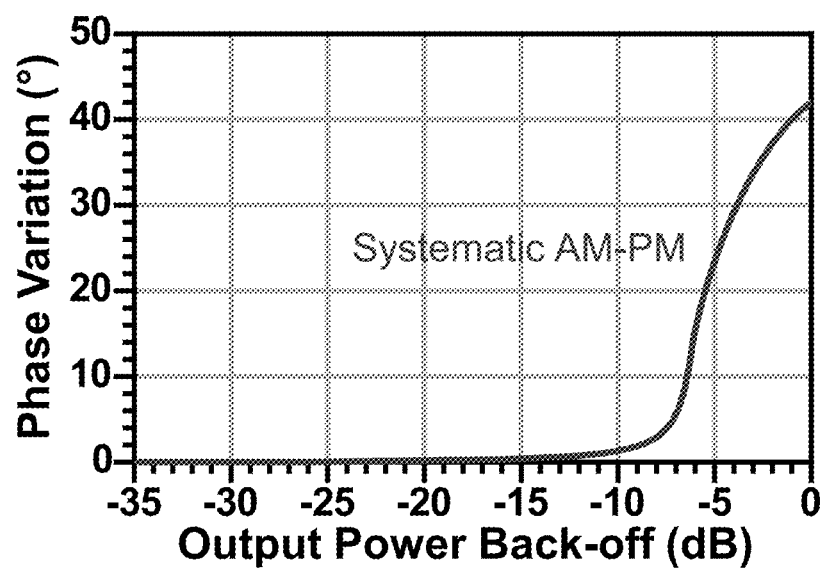

FIGS. 7A-7F shows the simulation results for a case with phase shift of 90° applied at the input. There is an appreciable amount of load modulation for both main 16 and auxiliary 18 amplifiers FIG. 7A), and the main amplifier 16 is less driven into deep saturation (FIG. 7B). The efficiency peaks at a back-off power of 6.2 dB (FIG. 7C), and the systematic AM-AM, captured by the simulation, is ~2.1 dB (FIGS. 7D-7F). A more general form of the equations can be applied in this case $$\text{Systematic } AM - AM = 2 \times \frac{\text{Real}\{Z_B\}}{\text{Real}\{Z_A\}} = 2 \times \frac{PF_B}{PF_A} \times \frac{|Z_B|}{|Z_A|} \quad (10)$$

$$LMR_{Main} = \frac{\text{Real}\left\{\frac{1}{Z_B}\right\}}{\text{Real}\left\{\frac{1}{Z_A}\right\}} = \frac{PF_B}{PF_A} \times \frac{|Z_A|}{|Z_B|}. \quad (11)$$

Note that since the main 16 and auxiliary 18 amplifiers operate in current mode and at the maximum power, they see different reactive loads and experience different amounts of saturation, the actual voltage phase shift at the combiner ports is not 90°, therefore the systematic AM-PM shown in FIG. 7F is slightly lower than the expected value of ~45° suggested by the first line of (6).

The above-mentioned behavioral characteristics of this intermediate design are in between those of the two previous ones; therefore by changing the input phase shift, a certain design goal (e.g., a required amount of systematic AM-PM) can be achieved, although the other specifications (e.g., the systematic AM-AM) will vary as well, in a manner that may result in an undesirable outcome.

An additional control parameter, with a somewhat independent influence, is useful to make the PA work in a more favorable fashion. The bias condition of the main 16 and auxiliary 18 amplifiers, especially the auxiliary amplifier 18, can provide such a control parameter. Since in practical devices the gm is usually bias dependent, as the bias voltage of the auxiliary amplifier 18 is varied, both the turn-on input power level and the gm change, affecting the overall AM-AM behavior as well as the back-off efficiency profile of the PA (similar to what happens in the Doherty architecture). For example, if the auxiliary amplifier is set to have a low bias voltage (deep class-C) it will turn on at a higher input power level and even after that, it will have a low gm (soft turn-on). This condition will lead the main amplifier 16 to go to deep saturation, which is beneficial in terms of back-off efficiency, but it is problematic in terms of linearity since the reduced Gm at saturation drops the gain. In contrast, a higher bias for the auxiliary amplifier 18 will result in a higher overall gain and a lower efficiency peak at back-off.

An additional feature of the FIG. 1 amplifier architecture results indirectly from the AM-PM variation caused by the device nonideality and impacts the impedance trajectories seen by the main 16 and auxiliary 18 amplifiers. The device related AM-PM arises mostly from the voltage dependent capacitance variation at the input and output nodes of each of the main 16 and auxiliary 18 amplifiers. The onsets of this phenomenon for the individual main 16 and auxiliary 18 amplifiers are at different power levels, due to their bias and supply voltage differences. As a result, there is a power-dependent phase variation between the main 16 and auxiliary 18 amplifiers, which together with the Chireix combiner result in "self-outphasing" that slightly changes the impedance trajectories at the intermediate power levels. To capture this effect in simulation a realistic device model is needed. The effect is shown in the simulated results (FIG. 10A) for an experimental SiGe power amplifier consistent with FIG. 1 (Shown in FIG. 9A-9B). Overall, the design methodology is to determine the input phase shift $\theta_0$ and the auxiliary amplifier 18 bias condition by testing values and narrowing selections until the best AM-AM and AM-PM are obtained.

Experimental Implementation and Simulation

Figure 8A:
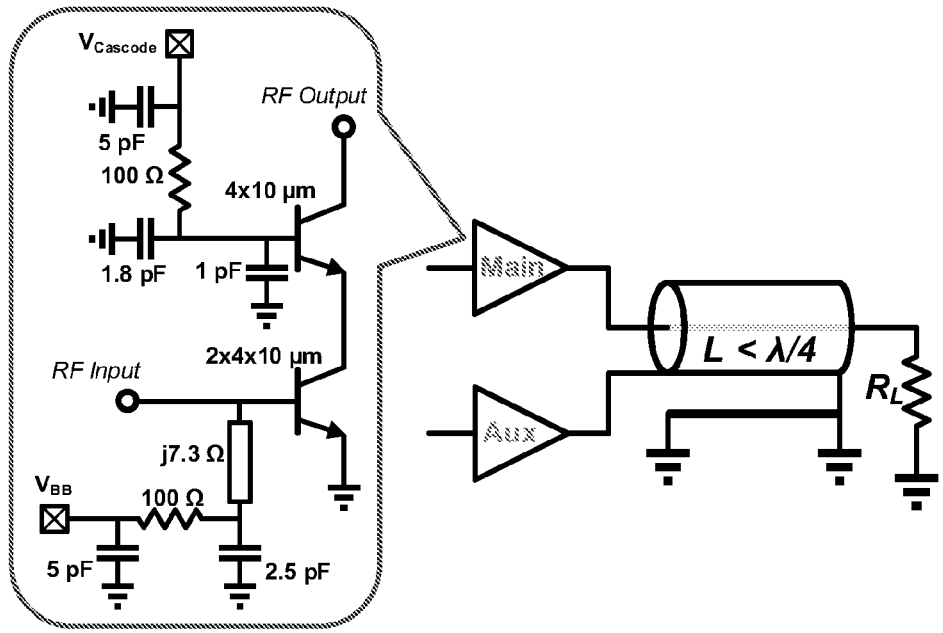
FIG. 8A shows a preferred circuit for the main amplifier of FIG. 1.

A previously-reported 28 GHz high-efficiency dual-input ouphasing PA, implemented in 130 nm SiGe BiCMOS (GF 8HP) process [8], was used as the core PA cell for the main 16 and auxiliary 18 amplifiers as shown in FIG. 8A. The combiner is implemented as a "triaxial balun" with electrical length of ~$\lambda$/5 using the top 3 metal layers of the process, achieving an exceptionally low loss of ~0.5 dB at 28 GHz (determined in a back-to-back balun measurement). A detailed model for the triaxial balun is provided in [8]. The main 16 and auxiliary 18 amplifiers employ a cascode cell with a smaller size top device (transistor that is 4×10 µm in FIG. 8A) to achieve the low output capacitance needed for the Chireix operation. The bias voltages are set in accordance with the desired mode of operation (i.e., class-C bias and higher $V_{CC}$ for the auxiliary amplifier 18). Base biases were provided through 100Ω on-chip resistors and the transistors drew 33.4 mA and 38.8 mA, measured at maximum power, from supply voltages of 3.7V and 4.3V for the main 16 and auxiliary 18 amplifiers, respectively.

Figure 8B:
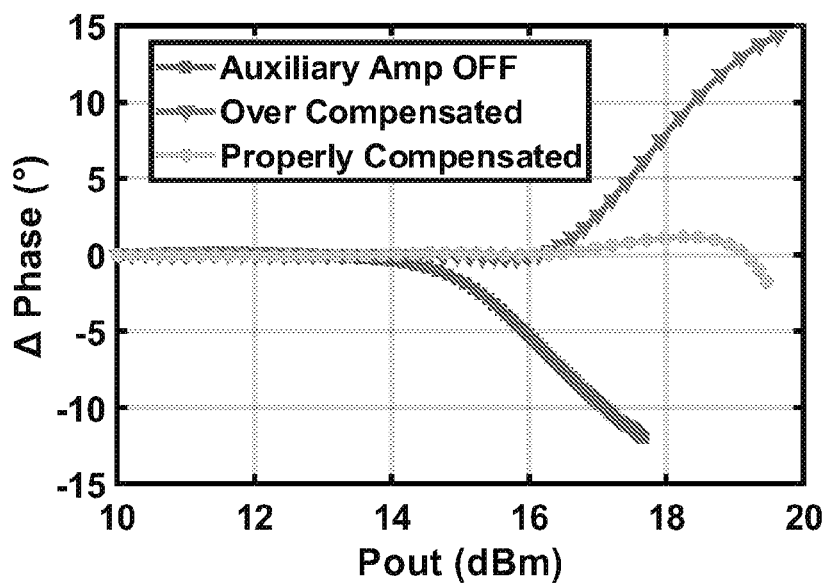
FIG. 8B shows the difference between proper compensation, overcompensation and no compensation (i.e., auxiliary amplifier off)

Post-layout simulation, fed by a pair of phase-shifted RF signal sources, confirms the predicted behavior in terms of efficiency and linearity. As shown in FIG. 8B, if the auxiliary amplifier 18 is completely turned off, the main amplifier 16 by itself introduces a noticeable amount of AM-PM distortion toward its saturation. A proper bias of the auxiliary amplifier 18 together with an appropriate phase shift, result in a flat AM-PM response.

Figure 9A:
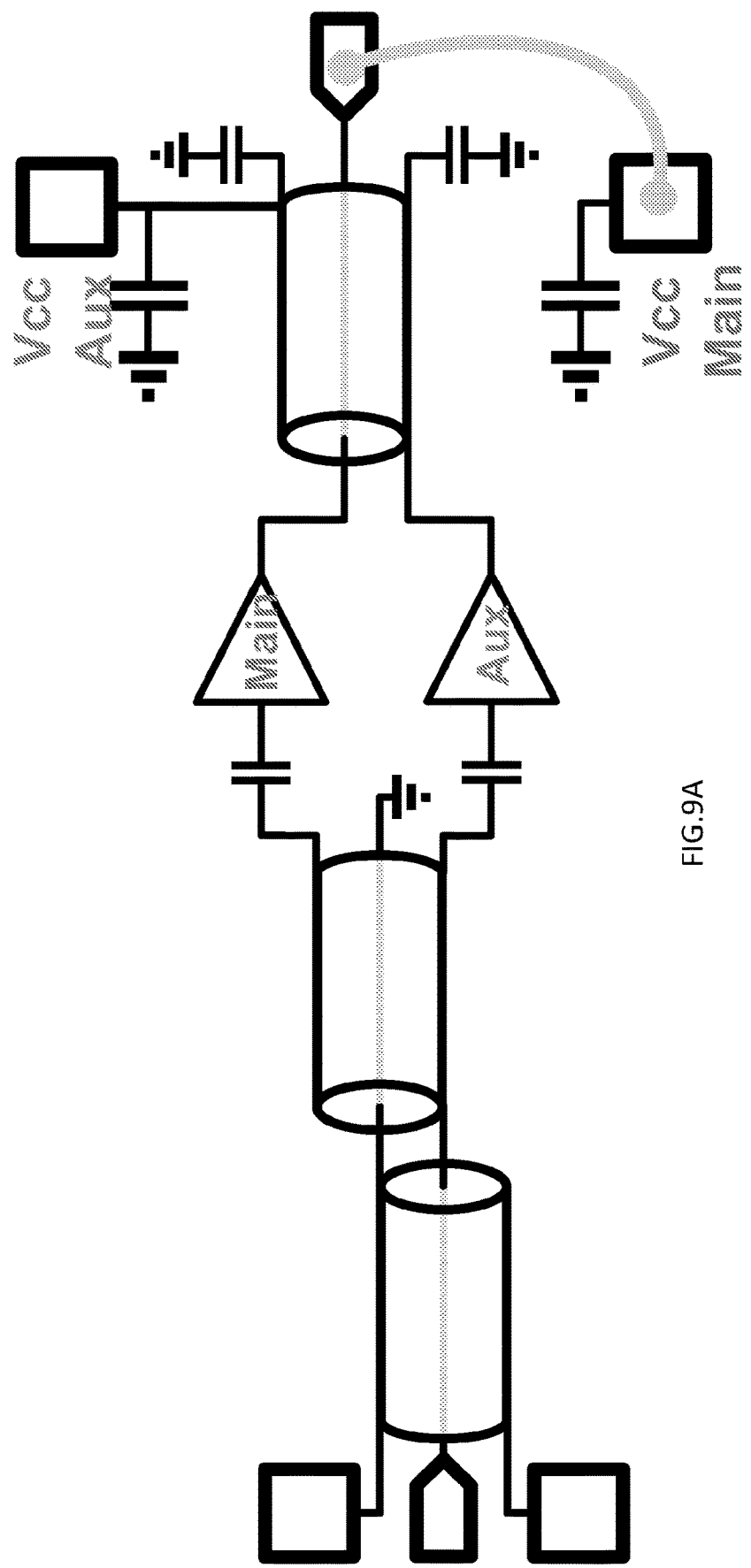
FIGS. 9A and 9B are a schematic and image of an experimental PA consistent with FIG. 1.
Figure 9B:
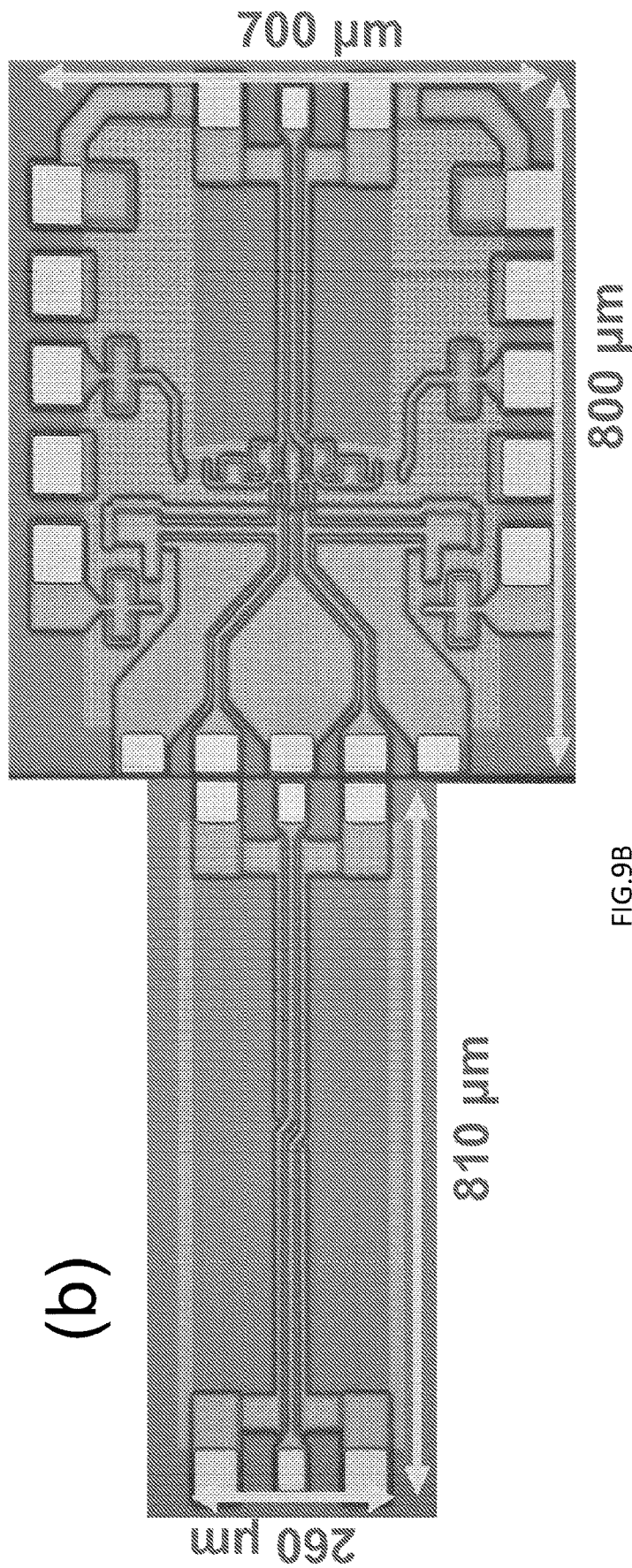

Based on the simulations, the signal phase shift due to the input impedance difference of the main 16 and auxiliary 18 amplifiers is sufficient for the desired operation ($\theta=\theta_1$) and there is no need for an explicit delay line at the input ($\theta_0=0°$). Therefore, the same RF signal is fed to both inputs of the core PA (main 16 and auxiliary 18 amplifiers), via DC blocking caps that are necessary because of the difference in the base bias of the main 16 and auxiliary 18 amplifiers. A back-to-back triaxial balun (fabricated to be tested separately) is used for this purpose. The core PA and the input signal splitter chips are attached next to each other on a board and connected via very short wirebonds, forming the overall PA (FIGS. 9A & 9B). The effect of the wirebonds is included in the simulations by using series inductors.

Figure 10A:
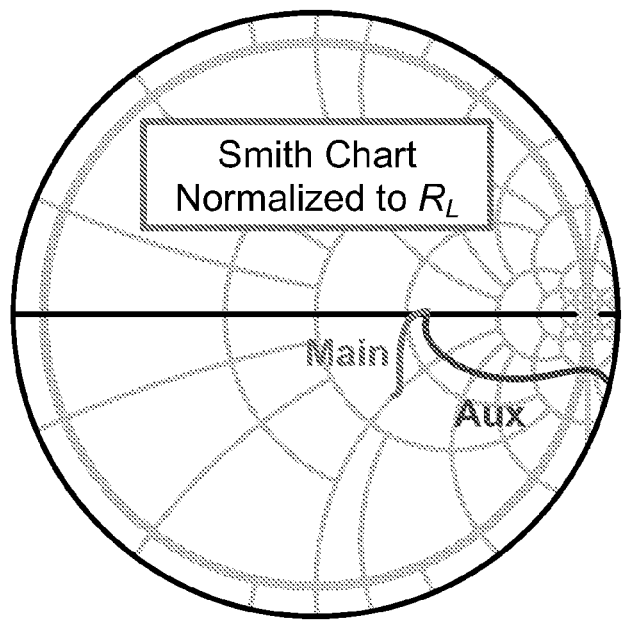
FIGS. 10A-10C show post-layout simulation results of the experimental PA while being driven from a single 28 GHz RF source.
Figure 10B:
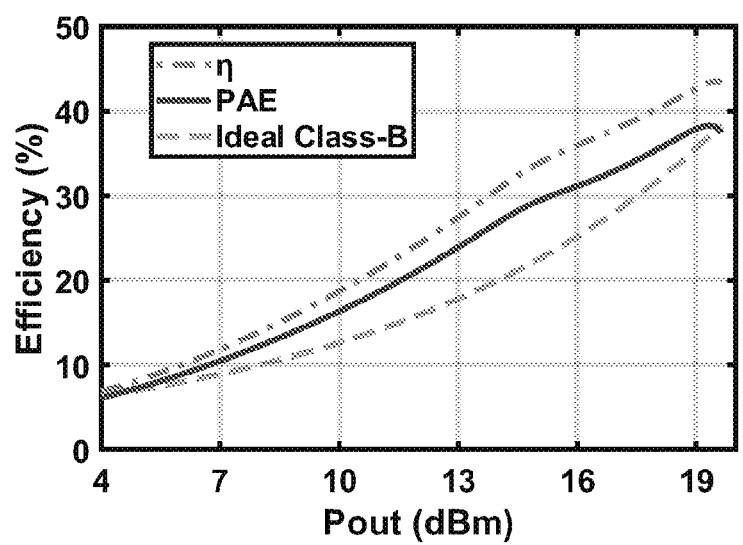
Figure 10C:
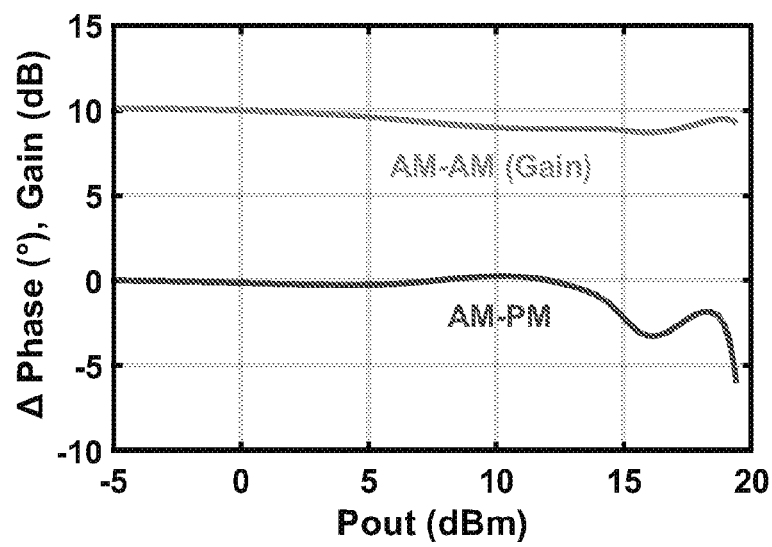

The post-layout simulation results while being driven from a single 28 GHz RF source, are shown in FIGS. 10A-10C. By manually de-embedding the 85 fF device output capacitance, the impedance variations seen by the internal current sources of the main and auxiliary amplifiers are captured (FIG. 10A). The trajectories shown here (with the Smith chart normalized to $R_L$) are slightly more curved than those in the idealized simulations of FIGS. 6A-7E, due to the "self-outphasing" phenomenon. The insertion loss of the output balun is the expected value of 0.5 dB and stays constant with respect to the output power. FIG. 10B shows that the PAE at 6-dB back-off is improved by 34% compared to an ideal class-B, while FIG. 10C shows the gain is flat to within 1 dB and the phase variation is below 5 degrees up to 19 dBm output power. The AM-AM and AM-PM variations remain in these ranges at least for 1 GHz of bandwidth, under the nominal bias condition.

Measurements and Comparison.

Figure 11A:
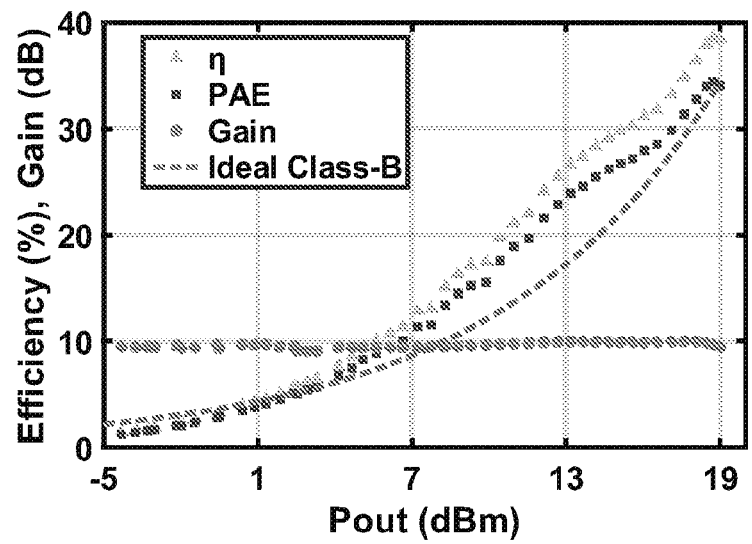
FIG. 11A shows the continuous wave (CW) test and FIG. 11B the overall AM-PM of the experimental PA with measurements taken at 27.5 GHz.
Figure 11B:
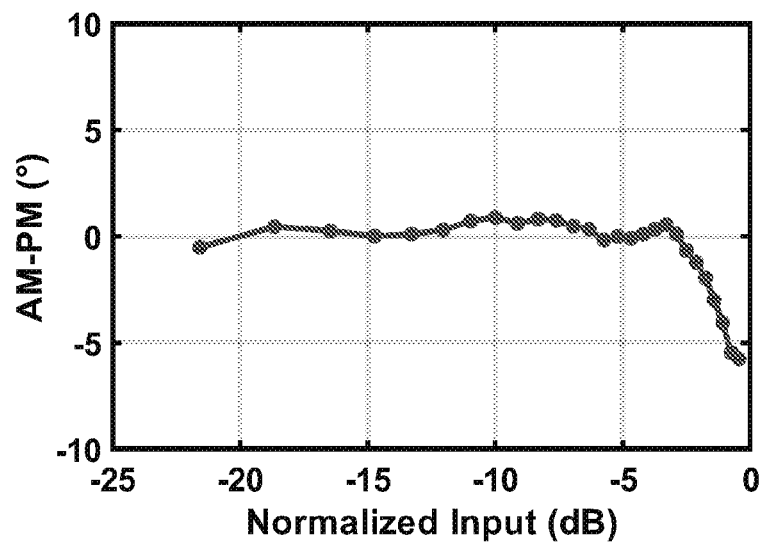

Measurements were carried out at 27.5 GHz (instead of 28 GHz) due to the presence of a slight mistuning in the circuit. FIG. 11A shows the continuous wave (CW) test result demonstrating more than 19 dBm Psat with peak PAE of 34.4% and 6-dB back-off PAE of greater than 23% that corresponds to 34% improvement over ideal class-B back-off behavior. The gain is also shown on the same plot; it is flat to within ±0.3 dB of 9.7 dB. The AM-PM shown in FIG. 11B is obtained from the modulated signal measurement under the same bias condition and has ±3.3 degrees variation.

Figure 12A:
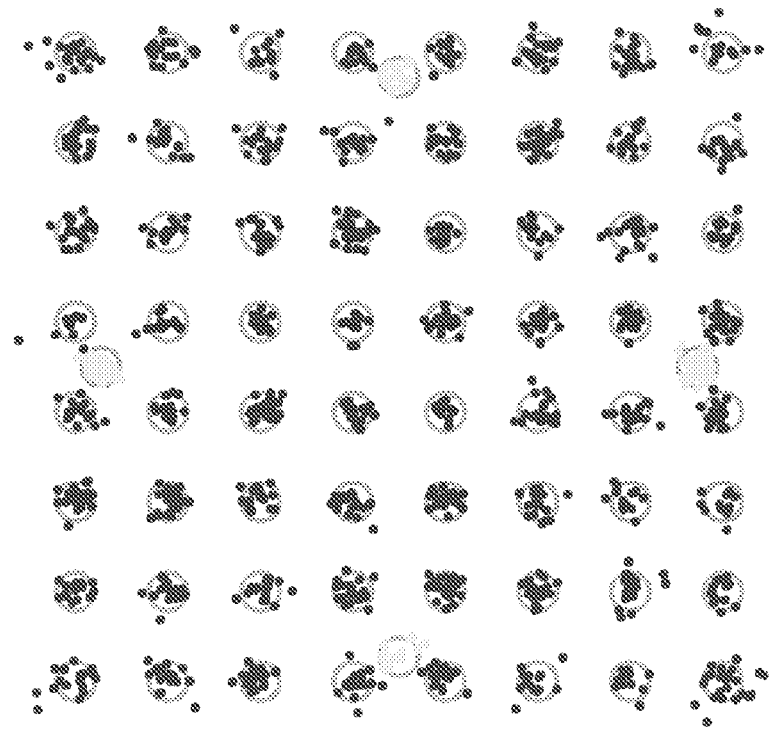
FIGS. 12A-12B show the resulting constellation and spectrum of the output signal of the experimental PA in response to a 100 MHz 64-QAM OFDM signal (generated with Keysight M8195A Arbitrary Waveform Generator and up-converted to 27.5 GHz).
Figure 12B:
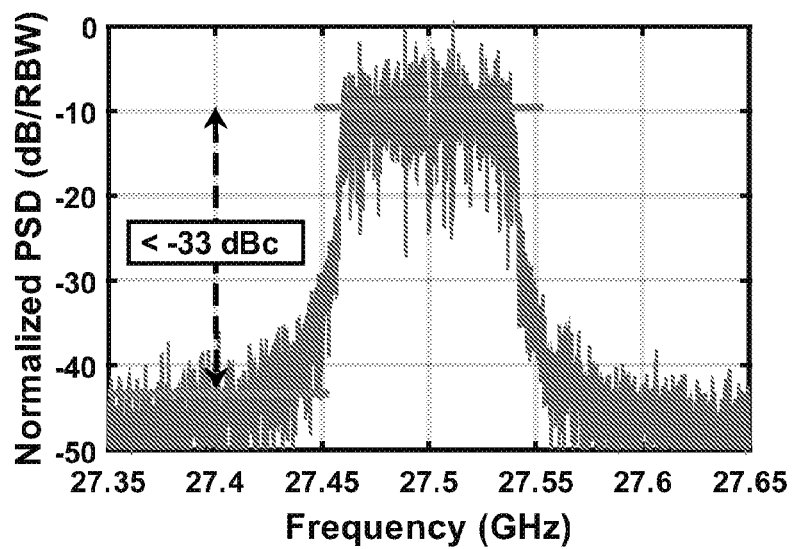

A 100 MHz 64-QAM OFDM signal (generated with Keysight M8195A Arbitrary Waveform Generator and up-converted to 27.5 GHz) was used to evaluate the dynamic performance (with output signal captured using Agilent DSO80604B 6 GHz 40GS/s real time oscilloscope after down-conversion to 2.5 GHz). Average collector efficiency of 22.9% and average PAE of 20.2% is obtained for 11.9 dBm output power. Linear equalization has been applied to the complete setup including the DUT (using Keysight VSA software), and with no DPD, EVM of 4.9% and ACLR better than −33 dBc (at 100 MHz offset from the carrier frequency) are achieved. FIGS. 12A and 12B show the resulting constellation and spectrum of the output signal.

Performance was compared to recently published state-of-the-art power amplifiers that modulate OFDM signals without employing digital enhancement. Given these constraints, the present amplifier presents the highest reported average efficiency for a silicon-based integrated PA.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims. A few examples of such modifications and alternatives are as follows. In addition to or instead of using different supply voltages for main 16 and auxiliary 18 amplifiers, the device sizes shown in FIG. 8A, can be chosen to be unequal for the main 16 and auxiliary 18 amplifiers. Also, the input power split 14, can be designed to provide unequal input powers to main 16 and auxiliary 18 amplifiers. While the preferred experimental embodiment was fabricated with SiGe HBT technology the architecture can be implemented in CMOS, CMOS-SOI, GaAs, GaN and other high frequency integrated circuit technologies Various features of the invention are set forth in the appended claims.

The invention claimed is:

1. A method for power amplification using circuitry including a main amplifier and an auxiliary amplifier that are constructed and operate such that:
   an input is applied to the main and auxiliary amplifiers via a passive input network;
   at low power levels the auxiliary amplifier is off and the main amplifier sees a large impedance;

at maximum power level both the auxiliary and main amplifiers operate at full power and there is a constant phase shift between them; and while transitioning from low to maximum power, systematic AM-AM and AM-PM variations are generated by the passive input network and load-pulling between the main and auxiliary amplifiers via a combiner that has a phase difference between main and auxiliary branches, wherein the systematic AM-AM and AM-PM variations compensate device related distortions that arise from varying voltage swings in transistors of the main and auxiliary amplifiers.

2. The method of claim 1, wherein the input network applies a constant phase shift in a path to one of the auxiliary and main amplifiers to achieve the signal phase shift at their outputs.

3. A method for power amplification using circuitry including a main amplifier and an auxiliary amplifier that are constructed and operate such that:

an input is applied to the main and auxiliary amplifiers via an input network;

at low power levels the auxiliary amplifier is off and the main amplifier sees a large impedance;

at maximum power level both the auxiliary and main amplifiers operate at full power and there is a constant phase shift between them; and while transitioning from low to maximum power, systematic AM-AM and AM-PM variations are generated and used to compensate device related distortions, wherein the input network applies a constant phase shift in a path to one of the auxiliary and main amplifiers to achieve the signal phase shift at their outputs, and wherein the phase distortion at the output is minimized by a balance between the device-induced phase distortion as the power level varies, and the systematic phase variation created by passive networks and operation of the main and auxiliary amplifiers, which varies the output phase as the auxiliary amplifier output power increases.

4. The method of claim 1, wherein the main amplifier comprises a class-AB amplifier.

5. The method of claim 4, wherein the auxiliary amplifier comprises a class-C amplifier.

6. The method of claim 1, wherein the auxiliary amplifier comprises an amplifier that uses a power-level dependent input bias voltage applied to the gate or base of the transistors that causes them to operate in a mode that changes continuously between class-C and class-AB.

7. The method of claim 1, comprising turning the auxiliary amplifier on before the main amplifier enters saturation mode.

8. The method of claim 1, comprising operating the main amplifier at saturation and the auxiliary amplifier at monotonically increasing power levels after it is turned on.

9. The method of claim 1, comprising providing the auxiliary amplifier with a higher supply voltage (or larger transistor device size) than the main amplifier in order to match the voltage swings of the main and auxiliary amplifiers at maximum power.

10. The method of claim 1, comprising providing systematic AM-AM and AM-PM changes that are in the opposite direction of gain compression and AM-PM distortion caused by device non-idealities.

11. The method of claim 10, A method for power amplification using circuitry including a main amplifier and an auxiliary amplifier that are constructed and operate such that:

an input is applied to the main and auxiliary amplifiers via an input network;

at low power levels the auxiliary amplifier is off and the main amplifier sees a large impedance;

at maximum power level both the auxiliary and main amplifiers operate at full power and there is a constant phase shift between them; and while transitioning from low to maximum power, systematic AM-AM and AM-PM variations are generated and used to compensate device related distortions, wherein the input network applies a constant phase shift in a path to one of the auxiliary and main amplifiers to achieve the signal phase shift at their outputs, providing systematic AM-AM and AM-PM changes that are in the opposite direction of gain compression and AM-PM distortion caused by device non-idealities, and wherein the systematic AM-AM variation is produced by increasing output power of the auxiliary amplifier, and systematic AM-PM variation is produced by the input phase shift between the input paths to the main and auxiliary amplifiers in conjunction with the operation of the amplifiers and an output Chireix combiner.

12. The method of claim 1, wherein systematic AM-AM and AM-PM variation is produced using a phase shift between main and auxiliary paths and their biases, as well as an output Chireix combiner to meet linearity specifications without applying digital predistortion or any other correction method to the input.

13. A power amplifier, comprising:

an input;

a split to apply an input signal from the input to a main amplifier and an auxiliary amplifier;

a passive input network before the input of one of the main and the auxiliary amplifiers to provide a phase shift; wherein the main and auxiliary amplifiers and the output combiner are configured such that at low power levels the auxiliary amplifier is off and the main amplifier sees a large impedance;

at maximum power level both the auxiliary and main amplifiers operate at full power and there is a constant phase shift between them; and while transitioning from low to maximum power, the systematic AM-AM and AM-PM variations generated by the input phase shift and a load-pulling operation between the main and auxiliary amplifiers via the output combiner combiner compensate for device related distortions that arise from varying voltage swings in transistors of the main and auxiliary amplifiers.

14. The power amplifier of claim 13, wherein the main amplifier comprises a class-AB amplifier and the auxiliary amplifier comprises a class-C amplifier.

15. The power amplifier of claim 13, wherein the main amplifier comprises a class-AB amplifier and the auxiliary amplifier uses a power-level dependent input bias voltage applied to the gate or base of the transistors that changes their mode of operation continuously from class-C to class-AB.

* * * * *